(12) United States Patent
Adams et al.

(10) Patent No.: US 8,593,157 B2
(45) Date of Patent: Nov. 26, 2013

(54) ELECTROMAGNETIC SCANNING IMAGER

(75) Inventors: Christopher P. Adams, Somerville, MA (US); David S. Holbrook, Lexington, MA (US)

(73) Assignee: Walleye Technologies, Inc., Somerville, MA (US)

( * ) Notice: Subject to any disclaimer, the term of this patent is extended or adjusted under 35 U.S.C. 154(b) by 675 days.

(21) Appl. No.: 12/614,745

(22) Filed: Nov. 9, 2009

(65) Prior Publication Data

US 2010/0109680 A1 May 6, 2010

Related U.S. Application Data

(63) Continuation-in-part of application No. 11/353,882, filed on Feb. 14, 2006, now Pat. No. 7,626,400.

(60) Provisional application No. 60/653,228, filed on Feb. 15, 2005.

(51) Int. Cl.
*G01R 27/32* (2006.01)

(52) U.S. Cl.
USPC ..... 324/642; 324/22; 324/244.1; 324/750.23; 324/754.23; 324/542

(58) Field of Classification Search
USPC .............. 324/642, 22, 244.1, 750.23, 754.23, 324/542, 97; 342/22
See application file for complete search history.

(56) References Cited

U.S. PATENT DOCUMENTS 3,401,232 A * 9/1968 Goldhammer et al. ....... 348/197
3,754,271 A 8/1973 Epis
3,836,258 A 9/1974 Courten et al.

(Continued)

FOREIGN PATENT DOCUMENTS

EP 0389240 A2 9/1990
WO 9847020 A1 10/1998

(Continued)

OTHER PUBLICATIONS

Grossman, et al., "Terahertz active direct detection imagers," SPIE—Ints. Soc. Opt. Eng USA, vol. 5411 No. 1, 2004, pp. 68-77.

(Continued)

*Primary Examiner* — Jermele M Hollington
*Assistant Examiner* — Temilade S Rhodes-Vivour

(74) *Attorney, Agent, or Firm* — Reza Mollaaghababa; Thomas J. Engellenner; Pepper Hamilton LLP

(57) ABSTRACT

In one aspect, the present invention provides an imager, preferably portable, that includes a source of electromagnetic radiation capable of generating radiation with one or more frequencies in a range of about 1 GHz to about 2000 GHz. An optical system that is optically coupled to the source focuses radiation received therefrom onto an object plane, and directs at least a portion of the focused radiation propagating back from the object plane onto an image plane. The imager further includes a scan mechanism coupled to the optical system for controlling thereof so as to move the focused radiation over the object plane. A detector optically coupled to the lens at the image plane detects at least a portion of the radiation propagating back from a plurality of scanned locations in the object plane, thereby generating a detection signal. A processor that is in communication with the detector generates an image of at least a portion of the object plane based on the detection signal.

30 Claims, 14 Drawing Sheets

(56) References Cited

U.S. PATENT DOCUMENTS

| | | | |
|---|---|---|---|
| 4,227,807 A | 10/1980 | Pond et al. | |
| 4,850,693 A | 7/1989 | Deason et al. | |
| 4,995,102 A | 2/1991 | Ichinose et al. | |
| 5,020,886 A | 6/1991 | Takeda et al. | |
| 5,081,456 A | 1/1992 | Michiguchi et al. | |
| 5,104,225 A | 4/1992 | Masreliez | |
| 5,227,800 A * | 7/1993 | Huguenin et al. | 342/179 |
| 5,493,222 A * | 2/1996 | Shirai et al. | 324/244.1 |
| 5,541,727 A | 7/1996 | Rando et al. | |
| 5,570,189 A | 10/1996 | Salmon | |
| 5,675,349 A | 10/1997 | Wong | |
| 5,748,369 A | 5/1998 | Yokota | |
| 5,751,465 A * | 5/1998 | Melville et al. | 359/213.1 |
| 5,760,932 A | 6/1998 | Perchak | |
| 5,933,120 A | 8/1999 | Manasson et al. | |
| 6,084,396 A * | 7/2000 | Rao | 324/244.1 |
| 6,242,740 B1 | 6/2001 | Luukanen et al. | |
| 6,417,502 B1 | 7/2002 | Stoner et al. | |
| 6,473,049 B2 | 10/2002 | Takeuchi et al. | |
| 6,493,126 B1 | 12/2002 | Iizuka et al. | |
| 6,507,441 B1 | 1/2003 | Eisenberg et al. | |
| 6,660,193 B2 | 12/2003 | Myhre | |
| 6,687,036 B2 | 2/2004 | Riza | |
| 6,696,827 B2 | 2/2004 | Fazekas et al. | |
| 6,703,944 B1 | 3/2004 | Obradovich | |
| 6,736,004 B2 | 5/2004 | Evans et al. | |
| 6,747,536 B1 | 6/2004 | Miller, Jr. | |
| 6,748,797 B2 | 6/2004 | Breed et al. | |
| 6,777,684 B1 | 8/2004 | Volkov et al. | |
| 6,844,713 B2 | 1/2005 | Steber et al. | |
| 6,900,756 B2 | 5/2005 | Salmon | |
| 7,099,084 B2 | 8/2006 | Bi | |
| 7,214,940 B2 * | 5/2007 | Cluff et al. | 250/341.1 |
| 7,248,204 B2 | 7/2007 | Lovberg et al. | |
| 7,626,400 B2 | 12/2009 | Holbrook et al. | |
| 2003/0173977 A1 * | 9/2003 | Little, Jr. | 324/637 |
| 2004/0080448 A1 | 4/2004 | Lovberg et al. | |
| 2004/0255477 A1 | 12/2004 | Levine et al. | |
| 2005/0078303 A1 | 4/2005 | Murray | |

FOREIGN PATENT DOCUMENTS

| | | |
|---|---|---|
| WO | 9961942 A1 | 12/1999 |
| WO | 0137029 A1 | 5/2001 |
| WO | 02084796 A1 | 10/2002 |

OTHER PUBLICATIONS

Doyle, et al., "Stand-off detection of hidden threat objects on personnel at checkpoints and in public areas using active millimetre-wave imaging" Proc SPIE Int Soc Opt Eng; vol. 5619, 2004, pp. 90-97.

Lettington, et. al., "Techniques for millimetre-wave imaging," Proc SPIE Int Soc Opt Eng; vol. 5619, 2004, pp. 16-26.

Kyoung-Soo Doo, et al., "Stimulation of target detection in ultraviolet and infrared bands," SPIE USA, vol. 40, No. 11, Nov. 2001, pp. 2646-2654.

Lamb, et al., "A High-Precision Quasi-Optical Polarizer for Zeeman Splitting Observations," International Journal of Infrared and Millimeter Waves, Springer, Dordrech, NL, vol. 22, No. 5, May 2001, pp. 679-685.

International Search Report and Written Opinion for PCT/US2006/005133 dated Aug. 30, 2007.

International Search Report and Written Opinion for PCT/US2006/005133 dated Oct. 19, 2006.

* cited by examiner

PINE

POPLAR

VINYL TAPE ROLL

1/4" SCREW HEAD IN PINE

PVC

ELECTROMAGNETIC SCANNING IMAGER

RELATED APPLICATION

The present application claims priority as a continuation-in-part (CIP) application to a co-pending patent application entitled "Electromagnetic Scanning Imager" filed on Feb. 14, 2006 and having an application Ser. No. 11/353,882, which in turn claims priority to a provisional application entitled "Electro-magnetic Scanning Imager," filed on Feb. 15, 2005 and having a Ser. No. 60/653,228, which is herein incorporated by reference. Both of these applications are herein incorporated by reference in their entirety.

BACKGROUND

The present invention relates generally to imaging systems, and methods of imaging, and more particularly, to such systems and methods that can be utilized to acquire images of objects hidden behind visibly opaque obstructions.

A variety of conventional systems are available for obtaining images through visibly opaque materials. For example, X-ray systems have been utilized to acquire images of objects that are hidden from visual inspection by visibly opaque materials (e.g., anatomical structures or objects within a luggage). X-ray systems, however, have many disadvantages. By way of example, such systems can be expensive and bulky, and can utilize ionizing radiation that may pose health hazards to humans. Moreover, X-ray systems typically detect a beam that has been transmitted through a target sample, thus requiring access to both sides of the target.

Ultrasound imaging systems, in turn, require the presence of a continuous, high quality acoustic transmission path between a transducer and a "hidden" object of interest. In many cases, however, such acoustic transmission paths may be not be available.

Millimeter-wave imaging systems have recently been developed for securing screening applications. Such conventional millimeter-wave systems are, however, complex, costly and bulky.

Accordingly, there is a need for enhanced imaging systems and associated image acquisition methods for obtaining images of objects behind visibly opaque obstructions, e.g., images of interiors of walls/floors/ceiling, boxes, suitcases and the like. There is also a need for such imaging systems that are field portable. Further, there is a need for such systems and methods that can be utilized for screening luggage and other containers for hazardous substances, e.g., explosive materials and devices.

SUMMARY

The present invention generally provides imaging systems operating in a frequency range of about 1 GHz to about 2000 GHz that allow acquiring, and displaying, images of objects, and particularly of objects that are hidden from view by visibly opaque materials.

In one aspect, the present invention provides an imaging system that includes a source of electromagnetic radiation that is capable of generating radiation with one or more frequencies in a range of about 1 GHz to about 2000 GHz (one or more wavelengths in a range of about 0.015 mm to about 30 mm). The imaging system further includes an optical system that is optically coupled to the source so as to focus radiation received therefrom onto an object plane. The optical system directs at least a portion of the focused radiation propagating back from the object plane onto an image plane. A scan mechanism is coupled to the optical system for controlling thereof so as to move the focused radiation over the object plane. A detector, which is optically coupled to the optical system at the image plane, detects at least a portion of the radiation propagating back from a plurality of scanned (illuminated) locations in the object plane, thereby generating a detection signal (typically a time-varying signal). And a processor, which is in communication with the detector, generates an image of at least a portion of the object plane based on the detection signal.

The terms "object plane" and "image plane" are known in the art. To the extent that any further explanation may be needed, the term "object plane" can refer to plane—which can contain one or more surfaces (or surface portions) of one or more objects—whose image is desired. And the image plane can refer to a plane on which the image of the object plane (or a portion thereof) is formed, e.g., the surface of a detector. In some cases, the object and image planes can have not only a two-dimensional extent but also a depth, e.g., one associated with depth of focus of the radiation on the object plane.

A variety of radiation sources and detectors can be employed. Some examples of suitable radiation sources include, without limitation, Gunn oscillators, magnetrons, IMPATT diodes, Dielectric Resonator Oscillators (DROs), and MIMICs. Some examples of suitable detectors include, without limitation, various types of circuitry incorporating a non-linear device such as a schottky diode. In some cases, the radiation source and the detector are formed as a single transmit/receive module operating in the frequency range of interest. By way of example, a Gunnplexer can function as such a transmit/receive unit.

In a related aspect, the imager further includes a position sensor coupled to the scan mechanism for determining a position thereof relative to a reference position. The position sensor is in communication with the processor to communicate the position of the scan mechanism, and consequently the location of the focused radiation on the object plane, to the processor. The processor, in turn, maps variations of the detection signal to one or more respective locations in the object plane from which the back-propagating radiation giving rise to the detection signal originates. The processor utilizes this mapping to generate an image of at least a portion of the object plane illuminated by the radiation.

In another aspect, the imager includes a display in communication with the processor for displaying an image of at least a portion of the object plane generated by the processor. By way of example, the processor can apply image drive signals to the display to cause display of a plurality of pixels, each corresponding to a location on the object plane, where the intensity of each pixel is proportional to the strength of the back-propagating radiation originating from that location.

In a related aspect, the scan mechanism can be adapted to cause the optical system to generate a variety of radiation scan patterns on the object plane. Some examples of such patterns include, without limitation, a generally elliptical (e.g., circular) pattern, a spiral pattern, a floret pattern or a raster pattern.

In another aspect, the imaging system is adapted to be moved by a user so as to scan the radiation, in combination with the scan mechanism, in two dimensions in the object plane. In such a case, the detection signal generated by the detector corresponds to back-propagating radiation originating from the scanned locations in the object plane. The processor maps variations of the detection signal to those scanned locations so as to generate an image of a region in the object plane, which includes those locations. Further, for each image point coordinate corresponding to one of the scanned locations, the display presents, in response to image drive signals provided by the processor, a brightness proportional to a strength of the detection signal corresponding to the back-propagating radiation from that scanned location.

In a related aspect, the imaging system includes means for generating data indicative of locations and orientations of the system (e.g., relative to a reference location/orientation), as it is moved by a user (e.g., over a wall surface) and for communicating that data to the processor. Such means can include a variety of sensors, such as tracking balls with orthogonal rotation encoding devices and inertial sensors. The processor utilizes the data for mapping the detection signal to the scanned locations over the object plane.

In some cases, the processor correlates a plurality of partially overlapping image frames to form an image of a portion of the object plane. By way of example, the processor can utilize one or more pixels in an overlap region between two image frames as reference for determining relative positions of the other pixels in the two image frames. This process can be repeated for other overlapping regions so as to build an entire image.

In another aspect, the imaging system can comprise a portable housing, preferably handheld, in which various components of the system (e.g., radiation source, scanner, lens) are disposed. The imaging system can comprise an electronic processing and display module (EPDM) that includes the processor and/or the display. The EPDM can be integrated within the portable housing containing the other optical components, or can be contained within a separate enclosure that is in communication with the portable housing.

In another aspect, the imaging system comprises a focus drive mechanism coupled to the optical system for varying an axial distance between the optical system and the transmit/receive module so as to focus the radiation at a plurality of axially separated object planes. In some embodiments, the source is capable of being frequency tuned (e.g., via a tuning mechanism) so as to allow focusing the radiation via a longitudinal chromatic aberration of the optical system onto axially separated object planes.

In a related aspect, in the above imaging system, a position sensor is in communication with the focus drive mechanism for determining an axial position of the optical system relative to a reference position. The position sensor can communicate the optical system's position to the processor, which can, in turn, utilize this information to temporally correlate a detection signal at a given time to a respective object plane.

In another aspect, the imaging system includes a mechanism coupled to the source for modulating its radiation frequency. By way of example, the radiation frequency can be modulated over a range of about 24.1 GHz to about 24.2 GHz (e.g., about 100 MHz). By way of example, the modulation frequency can have an amplitude (i.e., excursion about a center frequency) that is about 1% of the center frequency.

In other aspects, a portable imager is disclosed that includes a source for generating electromagnetic radiation with one or more frequency components in a range of about 1 GHz to about 2000 GHz. The imager further includes means for directing radiation from the source to an object plane and for directing at least a portion of the radiation propagating back from the object plane to an image plane. Further, the imager includes means coupled to the radiation-directing means for controlling thereof so as to scan the radiation over at least a portion of the object plane, and means for detecting radiation propagating back from a plurality of scanned locations in the object plane and generating a detection signal. The imager also includes means for analyzing the detection signal so as to generate an image of at least a portion of the object plane.

In another aspect, the invention provides an imaging system that includes a handheld housing. The housing contains a source of electromagnetic radiation, a focusing system, a scan mechanism, a detector and a processor. The source is capable of generating radiation with one or more frequency components in a range of about 1 GHz to about 2000 GHz. The focusing system directs radiation generated by the source onto an object plane and directs at least a portion of the radiation propagating back from the object plane onto an image plane. The scan mechanism is coupled to the focusing system for controlling thereof so as to provide a one-dimensional scan of the radiation over the object plane. The detector is optically coupled to the focusing system at the image plane to detect at least a portion of the back-propagating radiation so as to generate a detection signal (e.g., a time-varying detection signal). The processor is coupled to the detector to receive the detection signal, and to analyze that signal. The housing is adapted for movement so as to scan the radiation, in combination with the one-dimensional scan, over a plurality of locations in a two-dimensional region of the object plane.

In a related aspect, in the above portable imager, the processor generates an image of the two-dimensional region based on the detection signals corresponding to the scanned locations. For example, the processor maps the detection signals temporally to respective scanned locations for generating the image. The imager can further include a display, mounted to the housing or remotely located, that is in communication with the processor for displaying the image.

In another aspect, the invention provides an imaging system that comprises a transmit/receive module capable of generating and detecting electromagnetic radiation having one or more frequency components in a range of about 1 GHz to about 2000 GHz. An optical system is coupled to the transmit/receive module for focusing the radiation onto a focal plane and for directing a portion of the radiation propagating back from the focal plane to that module for detection. The imaging system further includes a drive mechanism coupled to the optical system for varying an axial distance of a focusing element thereof relative to the transmit/receive module so as to axially vary a position of the focal plane. The transmit/receive module generates a detection signal corresponding to the radiation propagating from the varying focal plane. A processor is coupled to the transmit/receive module to analyze the detection signal for generating an image of an axial region over which the focal plane is varied.

In a related aspect, in the above imager, the position sensor is coupled to the drive mechanism for determining an axial position of the focusing element relative to a reference position. The position sensor communicates the information regarding the focusing element's axial position to the processor. The processor, in turn, analyzes the detection signal temporally as a function of the focusing element's axial position so as to map the detection signal at a plurality of time intervals to the axial locations of the focal plane. The imager can also include a scan mechanism coupled to the focusing element for scanning the radiation over a surface of the focal plane substantially perpendicular to the axial direction, and a scan position sensor that can determine the position of the scan mechanism relative to a reference. The processor analyzes the detection signal temporally as a function of the focusing element's axial position so as to map the detection signal at a plurality of time intervals to axial locations of the focal plane. Further, the processor can employ information from the scan position sensor to correlate detection signal originating from a focal plane to various coordinate points within that plane.

In another aspect, an imaging system is disclosed that includes a housing adapted for movement over a surface located at a distance from an object plane. A transmit/receive module (e.g., a Gunnplexer) disposed in the housing generates and detects electromagnetic radiation. The imaging system further includes an optical system that is optically coupled to the transmit/receive module to focus radiation received therefrom onto the object plane, and to direct at least a portion of the radiation propagating back from the object plane onto the transmit/receive module. A scanning system coupled to the optical system rotates a focusing element thereof about a rotation axis, thereby moving the focused radiation over a region of the object plane. The imaging system further includes a position sensor in communication with the scanning mechanism to generate signals indicative of the position of the focusing element relative to a reference position. And a subsystem disposed in the housing generates signals indicative of location of the housing on the surface as the housing is moved over that surface. By way of example, the subsystem can comprise optical or inertial sensors. The imaging system further includes a processor in communication with the transmit/receive unit, the position sensor and the location-determining subsystem, which generates an image of at least a portion of the object plane based on the detected back-propagating radiation and signals generated by the position sensor and the subsystem.

In a related aspect, the imaging system can further include a display that is in communication with the processor for displaying the image. In some cases, the optical system and the scanning mechanism, as well as the processor and the display, are disposed in the same housing. In other cases, the processor and/or the display can be disposed in a separate housing.

In a related aspect, the processor generates a set of image point coordinates in a coordinate space of the object plane based on signals received from the position sensor coupled to the focusing element and the location-determining subsystem. Further, the processor applies a plurality of image drive signals to the display to effect the display of an image corresponding to those image point coordinates. The processor generates each image drive signal based on a strength of the detected back-propagating radiation originating from a location on the object plane corresponding to one of the image point coordinates. Each image drive signal, in turn, causes the presentation of an image point on the display, where the image point exhibits a brightness corresponding to the strength of the detected signal associated with a respective image point coordinate. The location of a displayed image point in the display is based on the position of the focusing element and the location of the housing at a time when back-propagating radiation originating from an object plane location corresponding to that image point is detected.

In a related aspect, the focusing element in the above imaging system comprises a diffractive optical element. In some cases, the diffractive optical element can comprise diffractive zones that are disposed about an optical axis that is offset from the element's rotational axis, which can be substantially centered relative to the emitting aperture of the transmit/receive module. A variety of diffractive optical elements can be employed, such as amplitude zone plates and phase zone plates. While in some cases, the optical and rotational axes of the focusing element are substantially parallel, in other cases, they can intersect at the aperture of the transmit/receive module.

In a related aspect, the emitting aperture of the transmit/receive module, the focusing element, and the focused radiation in the object plane generated by the focusing element are disposed in a confocal configuration.

In another aspect, the transmit/receive module comprises a frequency-modulating subsystem for modulating the frequency of the emitted radiation in response to a control signal.

In other aspects, an imaging system is disclosed that includes a transmit/receive module for generating and detecting electromagnetic radiation. The system further includes a telecentric lens system that receives and focuses the radiation onto an object plane. The lens system can comprise an eccentric rotatable lens disposed at a selected distance from a fixed lens. Further, the lens system directs radiation propagating back from the object plane onto the transmit/receive module for detection. A scanning mechanism is coupled to the rotatable lens for rotating the lens about a rotation axis, thereby moving the focused radiation in the object plane. The imaging system further includes a processor coupled to the transmit/receive module for generating an image of at least a portion of the object plane, which is illuminated by the radiation, based on the detected back-propagating radiation.

In a related aspect, the eccentric lens is disposed at a distance substantially equal to its focal length from the emitting aperture of the transmit/receive module. The eccentric lens collimates radiation received from the transmit/receive module and directs the collimated radiation along an off-axis direction to the fixed lens. The fixed lens, in turn, focuses the off-axis radiation onto the object plane.

In another aspect, the invention provides a method of imaging that includes providing a source of electromagnetic radiation that is capable of generating radiation with one or more frequency components in a range of about 1 GHz to about 2000 GHz. The radiation is focused from the source onto an object plane, and the focused radiation is scanned over at least a portion of the object plane. At least a portion of the radiation propagating back from the object plane is detected, thereby generating a detection signal, which is typically a time-varying signal. The detection signal is analyzed to form an image of the scanned portion of the object plane. The image can then be displayed.

Further understanding of various aspects of the invention can be obtained by reference to the following detailed description, in conjunction with the associated drawings, which are described briefly below.

DETAILED DESCRIPTION

Figure 1:
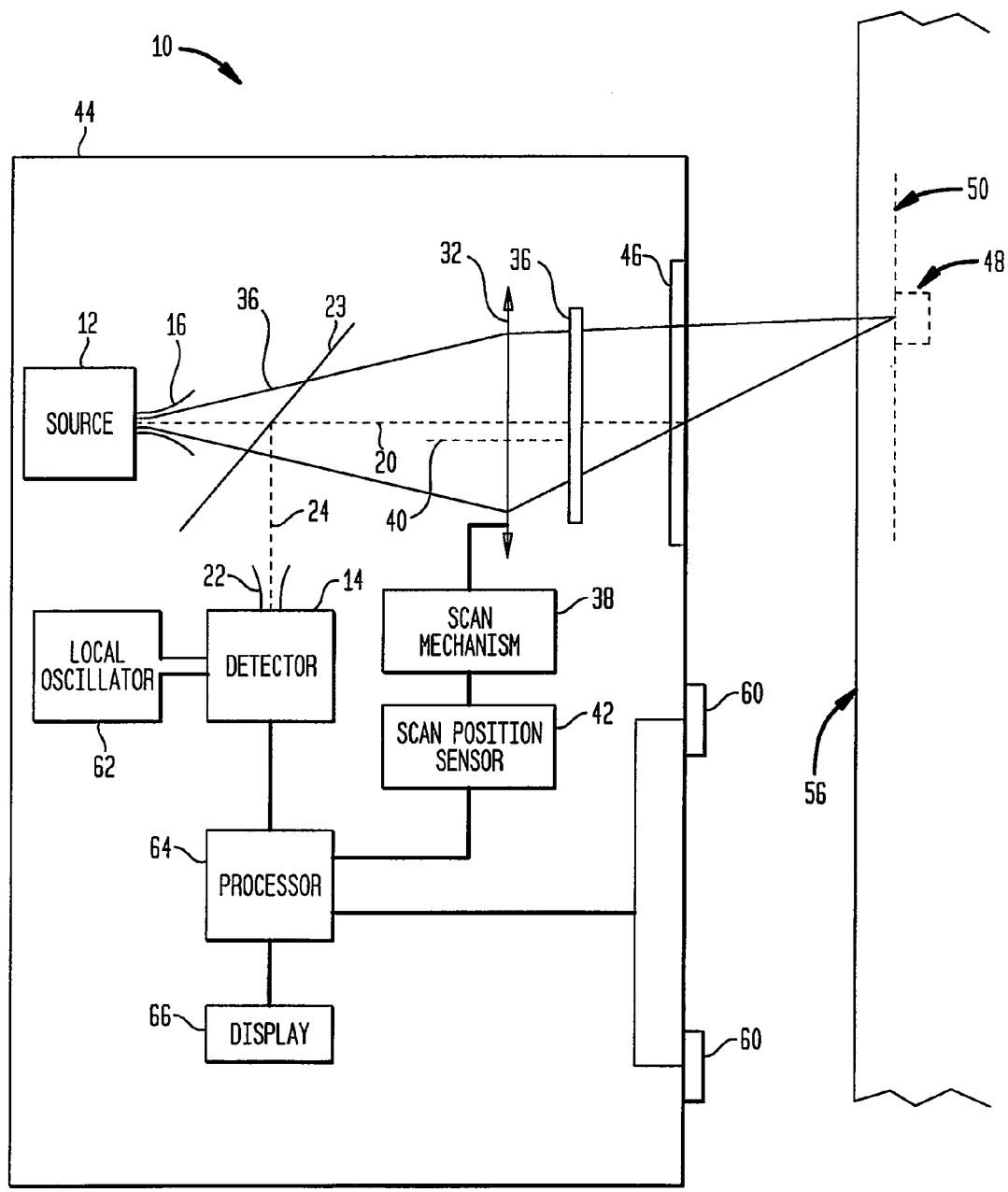
FIG. 1 schematically depicts an imaging system according to one embodiment of the invention, FIG. 2 schematically illustrates a wire grid polarizer suitable for use in the imaging system of FIG. 1 and other embodiments of the invention, FIG. 3 schematically depicts a Fresnel lens having a plurality of diffractive zones.

FIG. 1 schematically depicts an imager 10 (also referred to herein as a camera) according to one embodiment of the invention having a source 12 and a detector 14 for generating and detecting radiation, respectively. In this exemplary embodiment, the radiation source 12 is capable of generating radiation having one or more frequencies in a range of about 1 to about 2000 GHz, and preferably in a range of about 2 GHz to about 100 GHz. In many embodiments, one or more radiation frequencies are selected such that the radiation can penetrate an obstruction (e.g., a wall) that is generally opaque to visible radiation. Some examples of suitable radiation sources include, without limitation, Gunn oscillators, magnetrons, IMPATT diodes, Dielectric Resonator Oscillators (DROs), MIMICs, or other suitable radiation sources. A horn antenna 16 is coupled to the source so as to facilitate coupling the radiation generated by the source into free space (e.g., by providing a better impedance match) for propagation to an object to be imaged, as discussed further below. In this embodiment, the source, in conjunction with the horn, generates a diverging cone of radiation beam 18 disposed about a propagation axis 20 (herein also referred to as a rotational axis). Similar to the source, a horn 22 is coupled to the detector to facilitate coupling of radiation into the detector. In general, the combination of the detector 14 and its associated horn 22 is capable of receiving radiation beams disposed about a detector axis 24 with a given angular distribution that depends at least in part on the horn geometry.

In this embodiment and some that follow, without any loss of generality, the functioning of the imagers according to the teachings of the invention are discussed by considering acquiring images within a depth of a wall (or other obstructions) that is opaque to visible radiation. Such imagers can, however, be also utilized to acquire images of other objects. For example, the imaging systems of the invention can be utilized to image objects within containers.

The source 12 and the detector 14 are disposed on opposite sides of a beam splitter 23 such that the propagation axis 20 associated with the source and the detection axis 24 associated with the detector typically intersect at an approximately 90-degree angle. The beam splitter 23 is perpendicular to a plane formed by the propagation and the detection axes and is oriented such that a normal to its surface bisects the angle between those axes, e.g., it typically forms a 45-degree angle with each of those axes. The radiation emitted by the source passes through the beam splitter to be directed by other optical components onto a region of interest, as discussed below.

Figure 2:
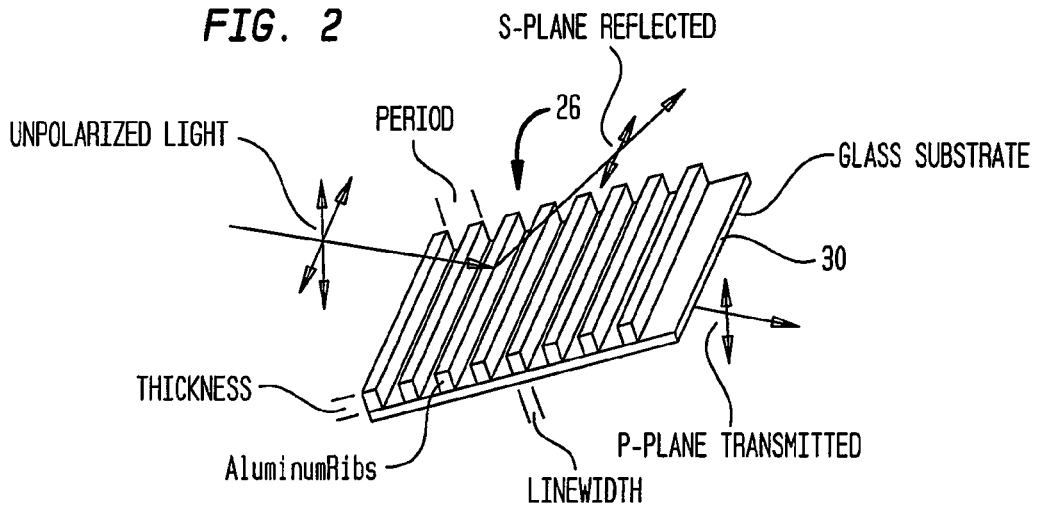

By way of example, the beam splitter 23 can be preferably implemented as a polarizing beam splitter having a polarization axis that is preferably oriented either parallel or perpendicular to a plane defined by the propagation and detection axes. In some embodiments, a so-called wire grid polarizer (WGP) is employed, which can be made, e.g., of a one-dimensional array or grid of very fine parallel electrically conductive elements disposed upon a suitable transparent base material or, e.g., by a grid of fine parallel wires strung on a frame. By way of example, FIG. 2 schematically depicts a wire grid polarizer 26 formed of a plurality of aluminum strips 28 disposed over a dielectric substrate 30 (e.g., a Teflon™ substrate). The spacing between adjacent parallel conductive elements is selected to be considerably less than the radiation wavelength generated by the source 12. This allows the component of the radiation having an electric field vector parallel to the grid elements to be reflected by the polarizer and the component having an electric field vector perpendicular to the grid elements to be transmitted through the polarizer. In this exemplary embodiment, each strip can have a width in a range of about $1/100^{th}$ wavelength to about $1/4$ wavelength, e.g., about 2 millimeters, and can be separated from an adjacent strip by a spacing in a range of about $1/100^{th}$ wavelength to about ¼ wavelength, e.g., about 2 millimeters.

Figure 3:
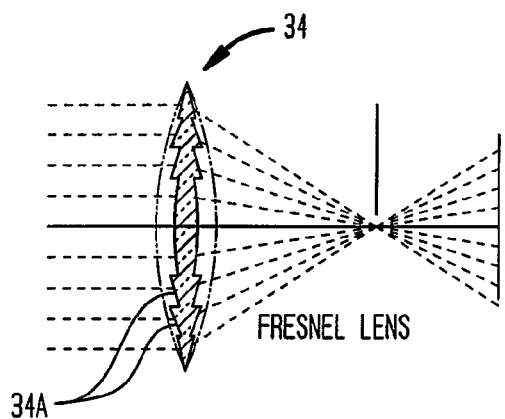

Referring again to FIG. 1, the imager 10 further includes a lens 32 that receives the radiation emitted by the source 12 after its passage through the polarizer 23. The lens 32 can have, e.g., a receiving cone of the order of f/1 or narrower. By way of example, the lens 32 can be a decentered optical element configured to operate, e.g., at approximately unity magnification. In some embodiments of the invention, the lens can be a diffractive lens having a diffractive pattern whose symmetry axis (optical axis) is laterally offset from its physical symmetry axis. For example, the lens can be a Binary Fresnel Lens (BFL) whose optical axis is offset laterally from its physical symmetry axis. As shown schematically in FIG. 3, an exemplary Fresnel lens 34 can include a plurality of diffractive zones 34a separated from one another by steps at each of which a phase discontinuity is generated in a manner that results in coherent interference of radiation passing through the different zones at a focal plane of the lens. In other words, the surface shape of a Fresnel lens can be viewed as a piece-wise approximation to the surface shape of a conventional refractive lens, e.g., such as that depicted by dashed lines. Further, a BFL can be viewed as a Fresnel lens in which each section of the approximation is further approximated by a staircase profile.

Figure 4:
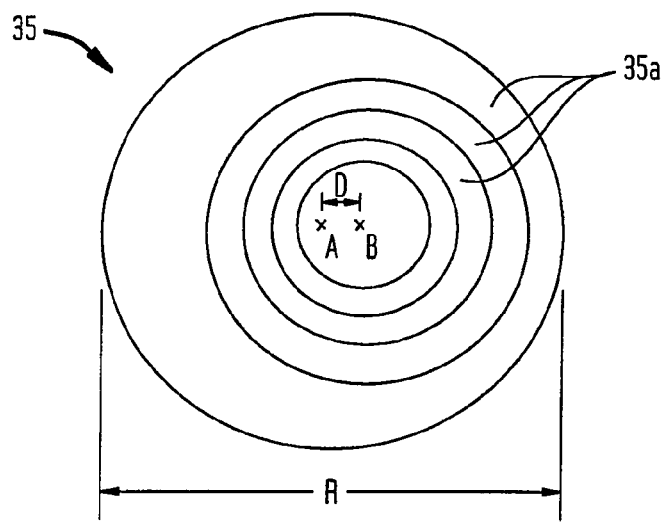
FIG. 4 is a top schematic view of a Binary Fresnel Lens (BFL) suitable for use in the imaging system of FIG. 1 as well as other embodiments.

In some embodiments of the invention, the BFL includes four steps each providing a ¼-wave phase delay. By way of example, FIG. 4 schematically depicts a BFL 35 suitable for use in various embodiments of the invention having a plurality of diffractive zones 35a disposed about an optical axis that is laterally offset from its physical center. In other words, an axis of symmetry of the diffractive pattern (perpendicular to the plane of the drawing at point B) is separated by a selected offset D from a physical symmetry axis of the lens (perpendicular to the plane of drawing at point A). In some embodiments, the BFL includes a diameter R (e.g., about 8 inches) and a focal length in a range of about 2 inches (about 5 cm) to about 10 inches (about 25 cm), e.g., about 8 inches (about 20.3 cm), with an optical axis offset in a range of about 1 inch (about 2.5 cm) to about 3.5 inches (about 8.9 cm), and more preferably about 2 inches (about 5 cm). As discussed in more detail below, the offset between the physical and the optical axis of the BFL 35 allows scanning the focal point of the lens about a generally elliptical path (e.g., a circular path) by rotating the lens about its physical axis.

Referring again to FIG. 1, in this exemplary embodiment, the imager 10 further includes a ¼-wave plate (QWP) 36 that is adapted to operate in a frequency range of interest (e.g., in a frequency range of about 1 GHz to about 2000 GHz). The QWP 36 is disposed in the path of the radiation between the polarizing beam splitter and an object to be imaged. While in this embodiment the QWP is placed between the lens and a wall 56, in other embodiments, the QWP can be disposed between the polarizing beam splitter and the lens, typically closer to the beam splitter at a location where the radiation beam diameter is relatively small.

Figure 5:
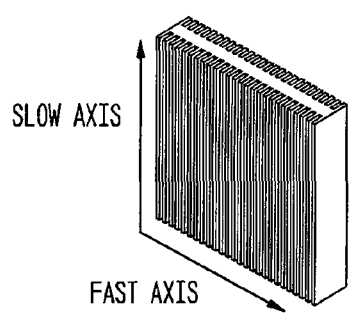
FIG. 5 is a perspective schematic view of a quarter-wave plate (QWP) suitable for use in the imaging system of FIG. 1 as well as other embodiments, FIG. 6 schematically depicts a scanning mechanism suitable for rotating the lens of the imaging system of FIG. 1 as well as lenses utilized in other embodiments, FIG. 7 schematically illustrates a circular scan pattern of radiation directed by an embodiment of an imaging system according to the invention onto an object plane, FIG. 8 schematically depicts a swath over an object plane illuminated by radiation from an imager according to an embodiment of the invention via rotation of a lens and concurrent translation of the imager over a surface substantially parallel to the object plane, FIG. 9 schematically illustrates that in some embodiments an imager according to teachings of the invention is operated at a selected tilt angle relative to a scanning plane over which it is translated, FIG. 10 schematically depicts a method of correlating pixels from a plurality of image frames acquired by an imager of the invention to build up an entire image, FIG. 11 schematically depicts a front view of an imager according to an embodiment of the invention having a display in which an image acquired by the imager is presented, FIG. 12 schematically depicts an imager according to another embodiment of the invention, FIG. 13A schematically depicts a Gunnplexer suitable for use as a transmit/receive unit in an imager of the invention, FIG. 13B schematically depicts further details of the Gunnplexer shown in FIG. 13A, FIG. 14 schematically depicts the transmit/receive unit as well as the lens of the embodiment of FIG. 12, illustrating that the rotation axis of the lens is offset relative to its optical axis.

In some embodiments, the QWP 36 can be implemented as a grooved dielectric plate, such as that schematically depicted in FIG. 5. For example, the QWP 36 can be fabricated by machining a plurality of grooves on a dielectric plate (e.g., a Teflon™ plate). The plate can have a thickness in a range of about 5 millimeters to about 80 millimeters, and the grooves can have a depth in a range of about 4 millimeters to about 70 millimeters and a width in a range of about $1/100^{th}$ wavelength to about ¼ wavelength of the radiation. Further, the center-to-center spacing between adjacent grooves can be in a range of about 0.1 millimeters to about 3 millimeters. The theory of operation of QWPs suitable for use in the frequency range of interest and typical techniques for their fabrication are described in an article entitled "A high precision quasi-optical polarizer for Zeeman splitting observation," by J. W. Lamb, M. Carter, and F. Mattiocco, published in Int. J. Infrared and Millimeter Waves, vol. 22, No. 5 (May 2001), incorporated herein by reference.

In this exemplary embodiment, the QWP 36 is disposed perpendicular to the propagation axis of radiation from the source 12 with its fast axis preferably oriented at +/−45 degrees from the plane of polarization of the outgoing radiation. As is well known in the art, linearly polarized radiation passing through a QWP oriented in this manner emerges from the QWP as substantially circularly polarized.

The imager 10 further includes a scan mechanism 38 coupled to the lens 32 for rotating the lens about its rotation axis (herein also referred to as the lens's physical axis). The lens is preferably disposed relative to the source such that its rotation axis is substantially coincident with the propagation axis of the outgoing radiation. As noted above, an optical axis 40 of the lens is displaced from its rotation axis by a predetermined distance, e.g., by about ½ of the radius of the lens. The optical axis of the lens can be parallel to its rotation axis, or alternatively, it can intersect the rotation axis at the emitting aperture of the source. As discussed in more detail below, the rotation of the lens 32 allows scanning the radiation at the focal plane of the lens over a path in an object plane.

Figure 6:
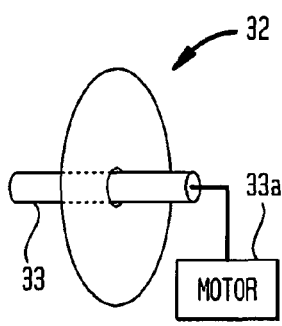

A variety of scanning mechanisms can be utilized in the practice of the invention. For example, referring to FIG. 6, a rotating shaft 33, which is driven by a motor 33a, can be coupled to the lens to cause the lens to rotate. Referring again to FIG. 1, in many embodiments, the imager further includes a lens scan position sensor 42 for indicating an angular rotation of the lens about the rotation axis relative to a predetermined reference. A variety of commercially available sensors can be employed. For example, optical sensors can be utilized to determine the angular position of the lens. An example of a suitable sensor is a shaft encoder that can provide information regarding angular position of a rotating shaft (such as the rotating shaft depicted in FIG. 6) to which the lens is coupled. In some embodiments, the lens scan mechanism 38 causes the lens to rotate at a substantially constant angular velocity with the scan position sensor 42 sensing the lens's angular position once, or more, per revolution using, e.g., a magnet on the edge of the lens and a fixed Hall effect sensor.

In this exemplary embodiment, various components of the imager, such as those discussed above, are disposed in a portable, preferably handheld housing 44. An optional window 46 (e.g., formed of a material transparent at the operating wavelength) is coupled to the housing 44 through which the radiation generated by the source can be transmitted to illuminate interior portions of the wall, as discussed further below. In other embodiments, no window is provided.

In operation, the lens 32 directs radiation generated by the source 12, after its passage through the beam splitter 23, via the QWP 36 and the window 46 into the interior of a wall (or other obstruction, or a region behind such an obstruction) to illuminate portions thereof, such as the object region 48. Preferably, the lens 32 forms an image of the source so as to create an illuminating focused point (e.g., an area of maximal radiation intensity) at a distance from the lens that is less than infinity and more than one focal length of the lens. In many embodiments, the radiation from the imager is focused onto an object plane (e.g., object plane 50) within the wall, and the radiation returning from that object plane is detected and analyzed to form an image thereof, as discussed in more detail below. In general, the object plane 50 has an axial extension (a depth) corresponding to the axial extension of the focal volume, as schematically illustrated by volume 48, which represents a portion of the object plane.

Figure 7:
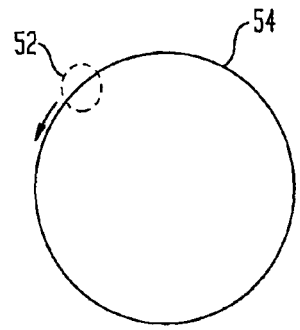
Figure 8:
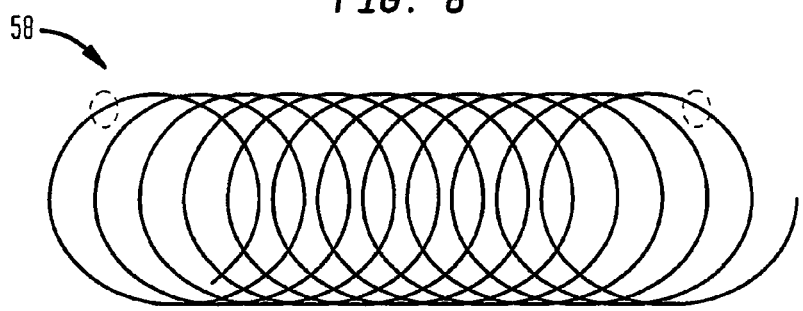

In this exemplary embodiment, the lens 32 is placed at a distance from the source substantially equal to twice its focal length, thereby forming an image of the source at a distance of approximately two focal lengths from the lens. Accordingly, the image is displaced radially from the rotation axis by twice the displacement of the lens's optical axis from the rotation axis. As shown schematically in FIG. 7, in this embodiment, as the scanner rotates the lens about its rotation axis, the illuminating point of radiation 52 sweeps out a circular path 54 around the rotational axis in the object plane 50 (FIG. 1). As the imager is translated laterally along an external wall surface 56 (see FIG. 1), e.g., by a user or an automated mechanism, the scan pattern of the illuminating radiation, generated by combined rotation of the lens and translation of the imager, covers a swath 58 on the object plane, as shown in FIG. 8.

Figure 9:
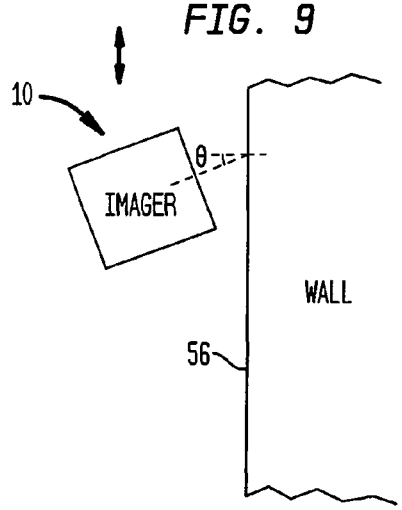

In some embodiments, it is preferable to operate the imager with a small tilt angle (e.g., approximately 7 degrees) between a scanning plane (e.g., a plane perpendicular to the lens's rotation axis) and a translation plane (i.e., the plane over which the imager is translated to build up an image of an area). For example, as shown schematically in FIG. 9, the imager 10 can be tilted by an angle (θ) relative to the wall surface 56 as it is translated along the wall. The tilt angle can be in or against direction of the translation. The use of such a tilt can increase the number of "look angles" the scanner produces (in the tilt plane), thereby increasing the probability of receiving a strong specular reflection from an illuminated object. In some embodiments, such a tilt is built in the imager, e.g., by disposing the imager's optical components at a selected tilt angle relative to its housing.

Referring again to FIG. 1, in many embodiments, the imager 10 further includes a plurality of sensors 60 coupled to its housing 44 for indicating the displacement of the housing relative to the wall surface 56 on which the imager is translated so as to obtain an image of an interior portion of the wall. Preferably, the imager can include at least two such location sensors physically separated such that each sensor would measure displacement of the housing relative to a starting reference along one of two orthogonal coordinate axes (e.g., two orthogonal Cartesian coordinates). In general, the displacement of the imager can be obtained by determining three degrees of freedom (e.g., two translational and a rotational degree of freedom). Each sensor can provide independent data regarding two degrees of freedom, and hence the combined data from two sensors is sufficient for determining three degrees of freedom associated with the translation of the imager over the wall. A variety of location sensors can be employed. By way of example, in some embodiments, each location sensor can be implemented as a tracking ball with orthogonal rotation encoding devices similar in design and construction to a computer mouse. In other embodiments, inertial sensors can be utilized. It should be understood that location sensors suitable for use in the practice of the invention are not limited to these examples, and other sensors (e.g., a variety of optical sensors) known in the art can also be employed.

As noted above, the combined rotation of the lens and the translation of the imager over the wall surface results in illuminating various locations within the interior of the wall. As the illuminating radiation impinges on an object that is not transparent to the radiation, e.g., a metal pipe and/or electrical wiring within the wall, at least a portion of the radiation is reflected or scattered. In the frequency range of about 1 to about 2000 GHz, most objects specularly reflect, rather than scatter, the radiation. Hence, at least some of the radiation incident on such objects within the wall is reflected back towards the imager, e.g., depending on the "look angle" of the illumination and a normal to the reflecting surface at the point of illumination. The lens collects this back-propagating radiation (or at least a portion thereof), after its passage through the QWP 36, and directs that radiation, as a converging radiation beam, to the beam splitter 23. As is known in the art, the passage of the returning radiation, which is circularly polarized (or at least substantially circularly polarized, as the reflection of the incident radiation may have cause some change in the polarization) through the QWP results in conversion of its polarization to linear polarization with a polarization axis normal to that of the linearly polarized radiation generated by the source. As such, the beam splitter directs this linearly polarized back-propagating radiation to the detector 14. In this embodiment, the detector 14 operates in heterodyne mode, that is, it mixes the returning radiation with radiation from a local oscillator 62 to generate an intermediate frequency (IF) electrical signal whose strength is proportional to the intensity of the returning radiation and whose lower frequency can be more readily processed by electronics circuitry. A variety of detectors and local oscillators can be employed. For example, in some embodiments, a receive diode of a Gunnplexer can be employed as the detector. In some other embodiments, a small portion of the transmit oscillator power can act as an oscillator for the receiver. In such a case, a single oscillator can be used for microwave emission as well as detection.

The detector 14 transmits the electrical signal generated in response to detection of the returning radiation to a digital data processor 64. The digital data processor is also in communication with the scan position sensor 42 and the location sensors 60 to receive information regarding, respectively, the angular rotation of the lens (herein also referred to as A(t)) and the location of the imager on the wall surface (herein also referred to as $P_1(t)$ and $P_2(t)$, where $P_1(t)$ denotes the information from the first location sensor 60 and $P_2(t)$ denotes the information from the second location sensor 60). The digital data processor employs the received data to map the time-varying detection signal to a plurality of respective locations on the object plane from which the back-propagating radiation originates. More specifically, the electrical signal, herein also referred to as I(t), is typically a time-varying signal whose strength at any instant is proportional to the intensity of the returning radiation detected by the detector 14 at that time. The intensity is related to the reflecting properties of the object that is at that time at the location where the illuminating radiation is directed. It will be understood by those familiar with the art of scanning image sensing that signal I(t) varies as a function of time because the lens is scanning the radiation in time over the object space. That is, $$I(t)=I[x(t),y(t)],$$

where x(t), and y(t) define the instantaneous position of the illuminating radiation in the object plane. In the remaining equations, the time dependence is dropped for convenience.

Digital data processor 64 transforms/inverts, and combines, the measurement A, $P_1(x,y)$, and $P_2(x,y)$ to generate x and y. In the exemplary embodiment of FIG. 1, location sensors 60 measure the rigid body x- and y-displacement of the imager body relative to an arbitrary starting location and the scan position sensor measures the angular position of the lens, known to be offset from the axis of rotation by a fixed distance (e.g., d) relative to the frame of reference of the imager housing. This can be expressed as:

$X_r = d\cos(A)$, and $Y_r = d\sin(A)$ where $X_r$ and $Y_r$ are the x and y coordinates of the lens relative to the axis of rotation in the frame of reference of the imager housing, and d is the off-axis distance to the imager spot.

Similarly, $X_h$, $Y_h$, and $\theta_z$ coordinates of the imager housing can be calculated from $P_1$ and $P_2$, where it is understood each of $P_1$ and $P_2$ comprises an x- and a y-measurement ($x_1$, $y_1$; $x_2$, $y_2$). For example, if the location sensor $P_1$ is selected as the housing reference point, then $X_h = x_1$, $Y_h = y_1$, and $\theta_z = \arctan\left[\dfrac{y_2 - y_1}{x_2 - x_1}\right] - \theta_0$ where $\theta_0$ is the initial angle relative to the x-axis passing through $P_1$ of the line connecting $P_1$ with $P_2$.

Finally, the position of the imaging spot can be calculated by adding the following three vectors: (1) a vector representing the rigid body displacement of the housing, (2) the position of the axis of rotation relative to the housing reference point, and (3) the displacement of the image point due to the angular rotation of the lens. More specifically, x and y can be obtained by employing the following relations:

$x = x_1 + D[\cos\theta_z \cos\theta_0 - \sin\theta_z \sin\theta_0] + d\cos A$, and $y = y_1 + D[\cos\theta_z \sin\theta_0 + \sin\theta_z \cos\theta_0] + d\sin A$, where D is the distance between $P_1$ and the axis of rotation.

The processor 64 is also adapted to generate image position drive signals suitable for application to an image display 66. The image position drive signals cause the display of a plurality of image points, each having a brightness that corresponds to the detected signal strength from a respective coordinate point in the object plane. In operation, a complete image is built up on the imaging display 66 as the imager's housing in moved over the wall surface (or in proximity thereof) while the imager's lens is rotated to scan the beam over an interior swath of the wall.

Figure 10:
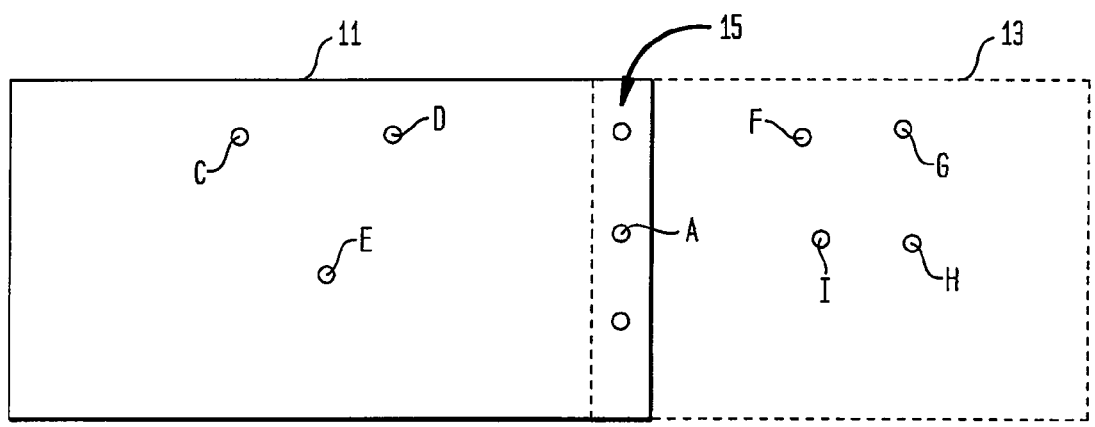

In some embodiments, relative locations of the pixels in an image obtained by combined rotation of the lens and translation of the imager are determined by acquiring a plurality of partially overlapping image frames, and tracking one or more pixels in the overlap regions. By way of example, FIG. 10 schematically depicts two image frames 11 and 13 that include an overlap region 15. At least one of the pixels in the overlap region (e.g., pixel A first observed in the image frame 11 and then repeated in a subsequent image frame 13) can then be utilized as a reference pixel to determine the relative locations of other pixels in the image frame 11 (e.g., pixels C, D and E) to those in image frame 13 (e.g., pixels F, G, H and I). The same process can be repeated for another image frame (not shown) that partially overlaps the image frame 13. In this manner, the relative locations of pixels in an image constructed by assembling a plurality of image frames can be determined.

Figure 11:
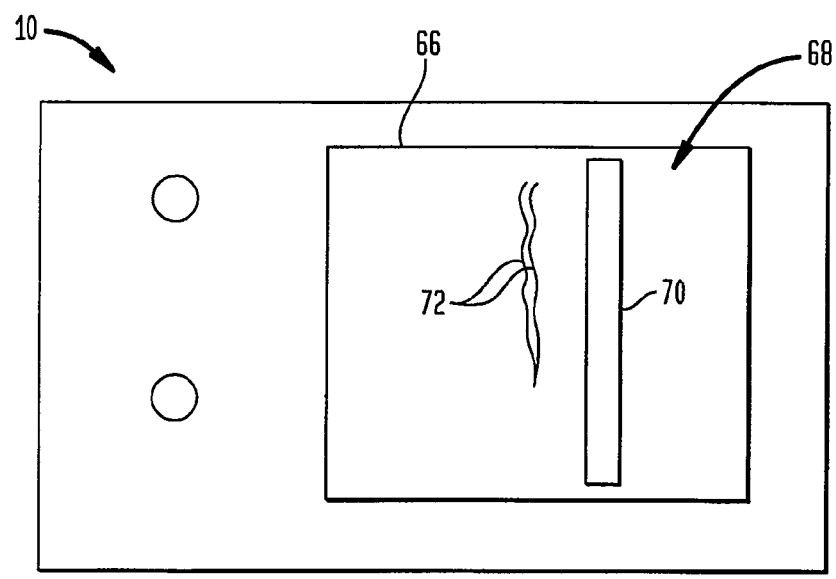

By way of example and only for illustrative purposes, FIG. 11 schematically depicts an exemplary image 68 of an interior portion of the wall scanned by the imager 10, which is presented in the imager's display 66. This exemplary image depicts a pipe 70 and a plurality of electrical wires 72 disposed within a depth of the wall. The imager can also provide images of other objects within the wall, such as, termites, water leaks, etc. In fact, any object that is sufficiently reflective (or scattering) at the interrogating radiation wavelengths can be imaged.

Although in the above embodiment, the processor 64 and the display 66 are housed within a single housing with the other components of the imager, in other embodiments, the processor and/or the display can be disposed in a separate housing. In embodiments in which the processor/display are disposed in a separate enclosure, one or more communications channels can be provided to allow the processor and/or display to communicate with one or more imager components disposed in another enclosure. In some cases, the communications channels employ wireless channels that utilize known wireless protocols.

Figure 12:
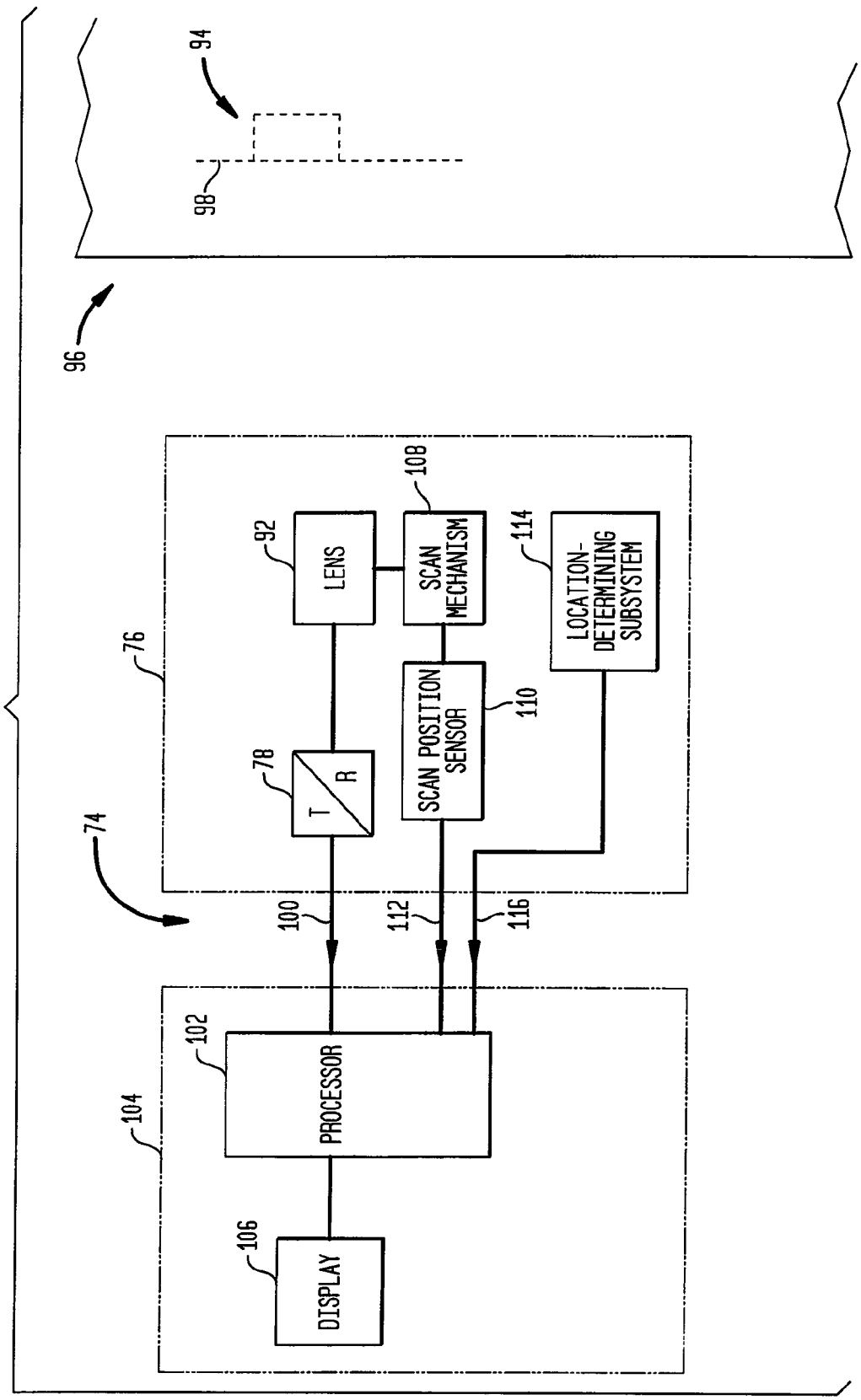
Figure 13A:
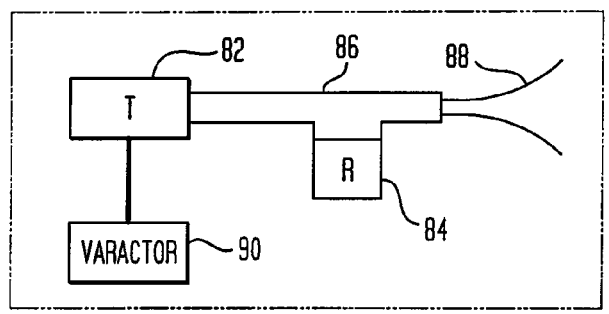
Figure 13B:
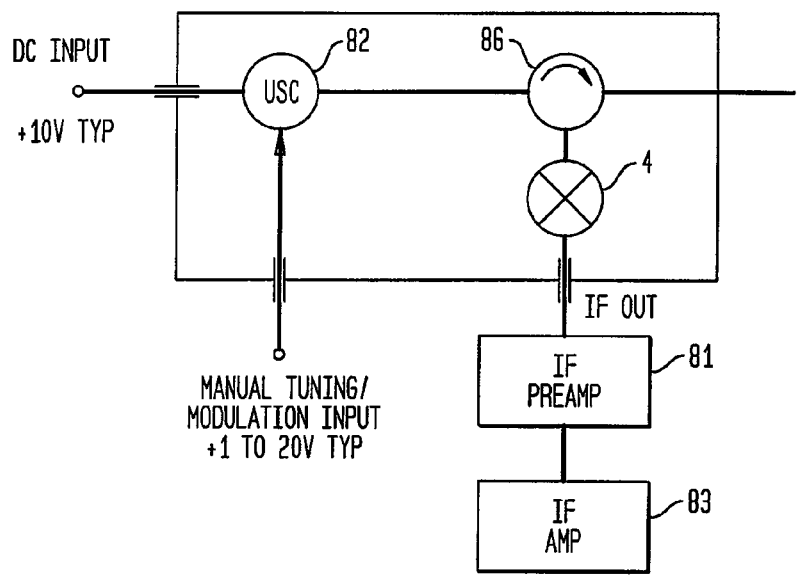

The implementation of an imager according to the teachings of the invention is not limited to the embodiment described above. In fact, such as imager can be implemented in a variety of different ways. For example, FIG. 12 schematically depicts an electromagnetic scanning imager 74 according to another embodiment of the invention that includes a head 76 containing a source of electromagnetic radiation 78 capable of generating radiation with one or more frequency components in a range of about 1 GHz to about 2000 GHz. In this embodiment, the source is combined with a detector of electromagnetic radiation capable of detecting radiation having the same frequency as that generated by the source. Such combined source/detector units are known the art, and are commonly referred to as transmit/receive (or transceiver) units. As shown schematically in FIGS. 13A and 13B, an example of a suitable transmit/receive unit is a Gunnplexer 80, which includes a Gunn diode 82 for generating radiation (it functions as the transmitter of the unit) and a receiver diode 84 for detecting the radiation (it functions as the receiver of the unit). A circulator 86 (e.g., a ferrite circulator) isolates the transmitter and receiver functions. A horn 88 facilitates coupling of radiation out of and into the Gunnplexer. The Gunnplexer can further include a tuning varactor diode 90, typically mounted close to the Gunn diode, for electrically varying (tuning) the outgoing radiation frequency. For example, the varactor can deviate the fundamental frequency (e.g., by about 60 MHz) when a proper tuning voltage is applied thereto. Gunn diode oscillators, which convert dc signals to RF energy, are available, e.g., at specific preset operating frequencies. The Gunnplexer can also include a Schottky mixer (not shown). The Gunn diode can function simultaneously as a transmitter and a local oscillator with a portion of its energy—in one configuration approximately 0.5 mW—being coupled to the mixer. The mixer can provide an intermediate frequency (IF) output that can be amplified by an IF pre-amplifier 81 and an IF amplifier 83.

Figure 14:
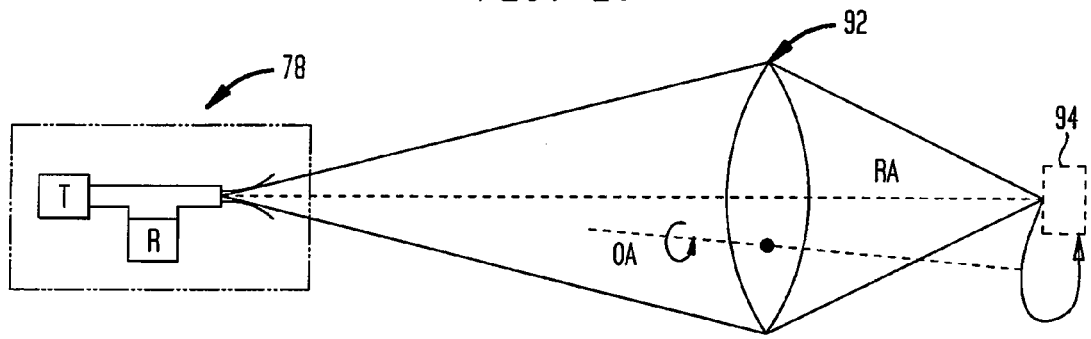

Referring again to FIG. 12 as well as FIG. 14, similar to the previous embodiment, the imager 74 further includes a lens 92 that is optically coupled to the transmit/receive unit 78 to form an image of the radiation generated by that unit in the general vicinity of an object region 94 of interest, which is typically located behind a visibly opaque material 96, e.g., the surface of a wall, floor or a ceiling. The lens 92 can be a transmissive, diffractive element (e.g., a zone plate) disposed relative to the source at a distance, e.g., greater than—but typically less than three times—its focal length. Generally, the lens 92 forms an image of the transmit/receive unit (an image of radiation generated by that unit) at a distance of less than infinity and more than one focal length from the lens, on the side of the lens away from the source. Alternatively, the lens can be reflective zone plate, in which case the image of source generated by the lens and the source itself are on the same side of the lens. As known in the art, a zone plate can be implemented as a magnitude zone plate (i.e., alternating regions of high transmission/reflection and regions of low transmission/reflection), or as a phase zone plate (e.g., alternating regions imparting zero or 180 degrees of relative phase shift to incident radiation).

The lens 92 is rotated about a rotation axis (illustrated as RA) by a scan mechanism 108, such as those discussed above in connection with the previous embodiment. Similar to the previous embodiment, an optical axis (OA) of the lens 92 is displaced relative to its rotation axis by a selected distance, e.g., about one-half the lens's radius. The rotation axis is generally centered on the emitting aperture of the transmit/receive unit 78 parallel to general direction of propagation of the radiation (parallel to the central ray of a cone-like bundle of rays). The optical axis can be parallel to the rotation axis, or may form a non-zero angle with the rotation axis so as to intersect that axis at the emitting aperture of the transmit/receive unit. The rotation of the lens causes the image of the source, generated by the lens, to scan a selected path (e.g., a generally circular path) over an object plane, in a manner similar to that discussed above in connection with the previous embodiment.

In some embodiments, the emitting aperture of the transmit/receive unit 78, the lens 92, and the image of the emitting aperture are preferably disposed in a confocal configuration. That is, the illuminating radiation is focused onto a small region in a plane of interest (e.g., the object plane), and the reflected (or scattered) radiation reaching the detector (the transmit/receive module in this case) is limited to those rays that originate from the illuminated region. In some embodiments, such a confocal imaging system is employed to reject stray light by utilizing, for example, two strategies: (1) by illuminating a single point (small area) at any given time with a focused beam such that the focused intensity drops off rapidly at axial locations away from that plane of focus (e.g., in front or behind that plane), and (2) by utilizing a blocking or a pinhole aperture, or a point detector, in a conjugate receiver plane so that light reflected (or scattered) from the illuminated object region is blocked from reaching the detector.

With continued reference to FIGS. 12 and 14, the combined rotation of the lens and translation of the imager's head over a surface of the obstruction 96 (e.g., a wall) can result in illuminating a region of interest behind the surface (e.g., an interior region of a wall). At least a portion of the illuminating radiation is reflected (or scattered) back toward the lens. The lens collects the radiation propagating back (e.g., via reflection) from the illuminated region and focuses the collected radiation onto the transmit/receive unit 78, which, functioning as a detector, converts the back-propagating radiation into an output electrical signal.

The output electrical signal is communicated, e.g., via a communication channel 100, to an electronic processor 102 (e.g., a digital data processor), disposed in an electronic processing and display module (EPDM) 104. While in this embodiment the EPDM is contained in a separate housing, in other embodiments, it can be integrated with the head 76 within a single housing. The processor 102 includes a signal processing module that is adapted to convert the output signal generated by the transmit/receive unit 78 into image strength drive signals suitable for application to an image display 106.

In addition to communicating with the detector, the processor 102 is also electrically coupled to a scan position sensor 110, e.g., via a communications channel 112, that can sense the position of the scan mechanism, and thereby that of the lens 92, relative to a predetermined reference position. A variety of scan position sensors, such as those discussed above, can be employed. The position sensor communicates the information regarding the position of the lens to the processor.

Similar to the previous embodiment, the imager 74 further includes a body location-determining subsystem 114 for determining the rigid body location of the head 76 on a surface (e.g., wall surface) over which it is moved to build up an image of a region behind the surface. The subsystem 114 can be in optical and/or mechanical communication with a surface over which the imager is translated. Typically, the subsystem 114 estimates the location and orientation of the head 76 via three parameters "$X_h$", "$Y_h$" and "$\theta_z$", where X, Y and Z denote orthogonal Cartesian coordinates. The X and Y denote coordinates in a plane (e.g., a planar surface of a wall over which the head is translated) and $\theta_z$ denotes an angle about the Z-axis that is perpendicular to that plane. By way of example, the origin of the coordinates can be established as the location and orientation of the imager upon its initial placement on the plane. This can be done automatically or by a user-issued command (which can also be employed to reset the location of the origin, if desired). The location-determining subsystem can then determine subsequent locations and orientations of the imager relative to the origin. A number of location-determining subsystems can be utilized. For example, in some embodiments, the subsystem can comprise two computer-mouse sensing mechanisms, separated by a known base line. Alternatively, the subsystem can be implemented by employing a plurality of inertial sensors.

The location-determining subsystem 114 transmits signals indicative of the location of the imager's head to the processor 102, e.g., via a communications channel 116. The processor utilizes these signals, together with those transmitted by the lens position sensor, to generate a set of image point coordinates in the coordinate space of the object region. The processor further correlates these image coordinates to the time-variation of the signal received from the detector to generate a reflectance image of the illuminated portion. In addition, the processor derives image position drive signals, based on the image coordinates and intensity of reflected signals originating from those coordinates, for application to the display 106. The image drive signals cause the display to present an image in which the brightness of an image point corresponds to the intensity of the detected reflected radiation originating from a coordinate point (e.g., an area or voxel in vicinity of that point) mapped to that image point.

In some embodiments, the frequency of the radiation generated by the source (e.g., the above transmit/receive unit 78) is modulated by a control signal. For example, in the above Gunnplexer 80 (FIG. 13A), the varactor 90 can be employed to cause such a frequency modulation. For example, the frequency can be modulated rapidly (e.g., at a rate of 100 kHz) over a relatively narrow range (e.g., 1% of the center frequency) to suppress coherent echoes, interference and/or speckle noise. Typically, the focal distance of the imager can represent about 100 waves and the reflected intensity is acquired at a rate of, e.g., 5 kHz. In such a case, the frequency of the radiation generated by the Gunnplexer can be modulated by about 1% at a rate of about 100 kHz to introduce a one-wave phase shift as each image pixel is acquired. Intensity integration during this phase shift can significantly reduce coherent artifact noise. It should be appreciated that other frequency modulation parameters can also be utilized based on the requirements of a particular application.

Snapshot Embodiments

In some embodiments, the imager can provide an image of a two-dimensional area while the imager (e.g., imager housing) remains stationary (i.e., without the need to physically move the imager). One such exemplary embodiment 118 shown in FIG. 15 includes a transmit/receive unit 120 for generating and detecting radiation, which preferably operates in a frequency range of about 1 GHz to about 2000 GHz. A lens 122 optically coupled to the transmit/receive unit receives the radiation and focuses it into an object region 124 whose image is desired. In some cases, the object region can be visibly hidden from view by an opaque obstruction, e.g., a wall portion.

Figure 16A:
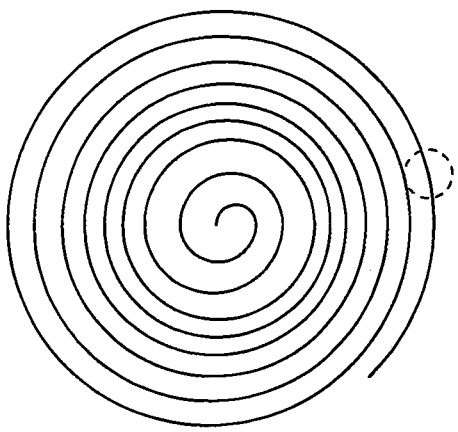
Figure 16B:
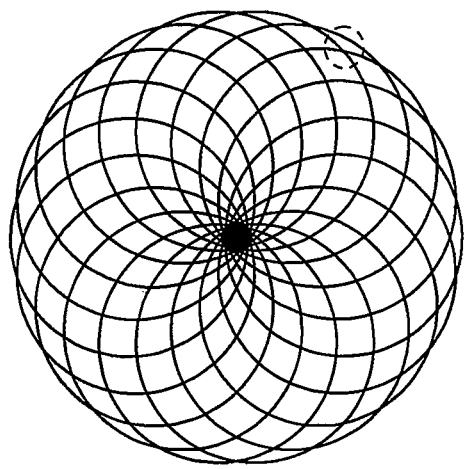
Figure 16C:
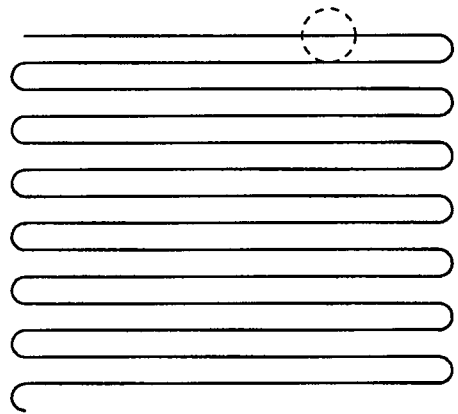

A scan mechanism 126 scans the radiation, which is directed by the lens to the region 124, over a plurality of locations in that region. Preferably, although not required, the radiation is collimated or nearly collimated before entering scan mechanism 126. The lens and the scan mechanism can be configured to produce a plurality of radiation scan patterns to cover (illuminate) at least a portion, e.g., an object plane 124a, within the region 124. The scan mechanism typically moves the radiation within a plane (e.g., a plane perpendicular to the lens's optical axis) so as to generate a desired radiation scan pattern. By way of example, FIG. 16A, 16B, 16C depict, respectively, a spiral, a floret and a raster scan pattern suitable for use in the practice of the invention. The spiral and the floret patterns can be generated, for example, by a combined rotation and radial motion (i.e., motion perpendicular to the optical axis of the lens) of the radiation. The raster pattern can be formed, in turn, by combination of two linear and orthogonal motions of the radiation. In each case, the focused beam size (e.g., shown schematically by dashed lines in FIGS. 16A-16C) can be selected such that the radiation scan causes illumination of a two-dimensional area of interest.

Figure 17A:
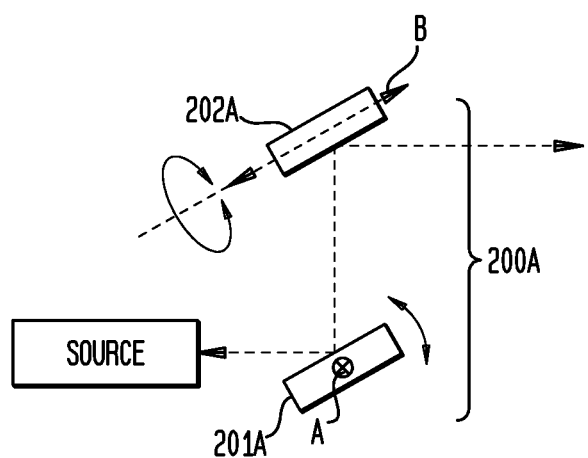

By way of example, FIG. 17A schematically depicts a radiation scan mechanism 200A optically coupled to the source for providing a two-dimensional radiation scan. The mechanism 200A includes two angularly rotatable reflective elements 201A and 202A that are configured to rotate about two orthogonal axes (depicted schematically as axes A and B, where axis A is perpendicular to the plane of the figure whilest axis B is in the plane of the figure). The reflective element 201 receives the radiation from the source and directs that radiation to the reflective element 202, which, in turn, directs the radiation to the lens (not shown). Rotation about axis A causes reflective element 201A to scan the radiation in the plane of the figure as the radiation propagates toward reflective element 202A. Similarly, rotation about axis B causes reflective element 202A to scan the radiation out of the plane of the figure as the radiation propagates to the lens. The relative rotational rates, scan angles, and timing of the rotations of the two elements can be adjusted so as to obtain a variety of scan patterns, such as those discussed above. In this exemplary embodiment of a two-dimensional beam scanner the most natural area scan pattern is a raster scan similar to that illustrated in FIG. 16C, though other scan patterns can also be utilized.

Figure 17B:
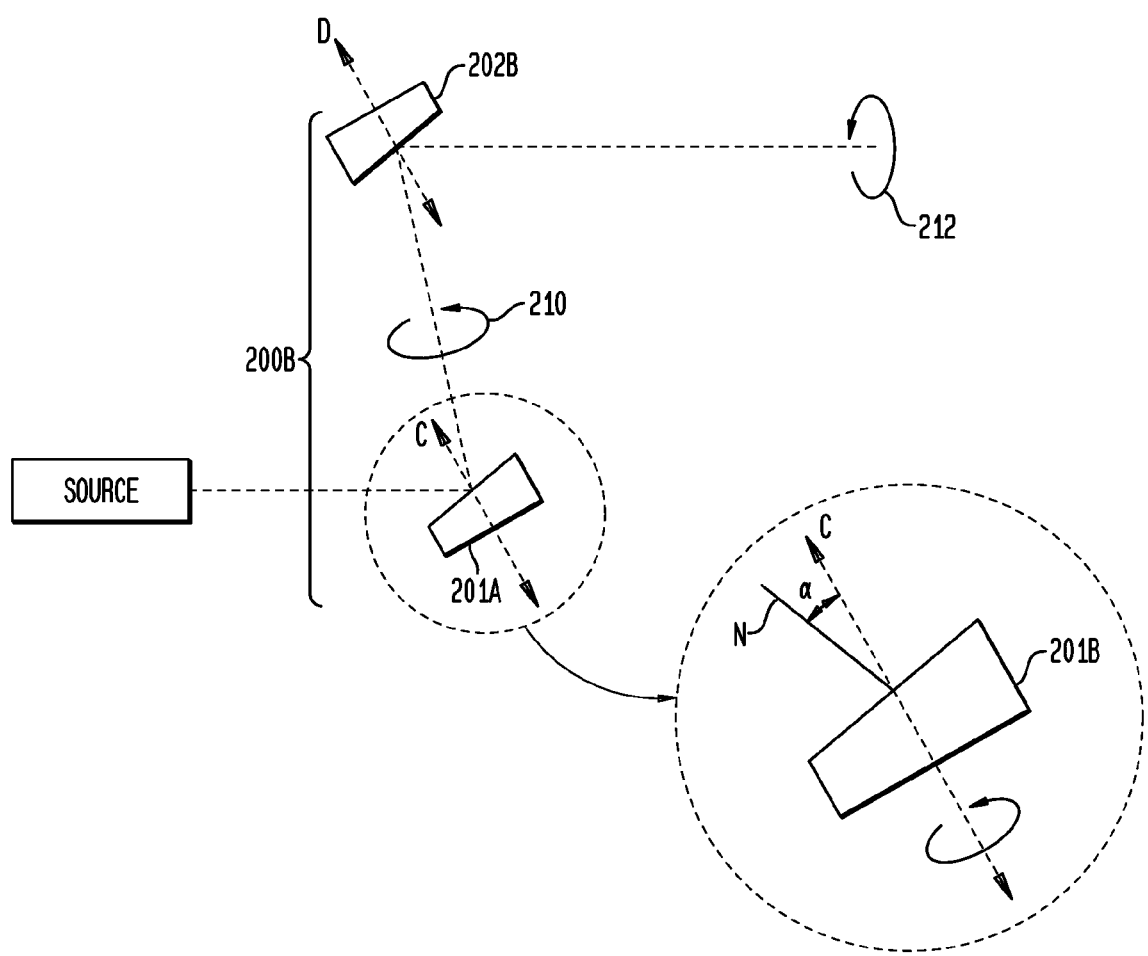

As another example, FIG. 17B schematically depicts a second radiation scan mechanism 200B optically coupled to the source for providing a two-dimensional radiation scan. This exemplary mechanism 200B is known as a "swash plate" scanner. Swash plate scanner 200B includes two rotatable, generally planar, reflective elements 201B and 202B that each of which is configured to rotate about axes (indicated by "C" and "D" respectively in FIG. 17B) that are at a slight angle, α, relative to the normal, N, of the respective reflective surface, as shown in the inset in FIG. 17B for reflective element 201B. Generally the rotation axis angle, cc, is displaced less than about 10 degrees from the normal to the reflective surface. The selection of angular displacement is a design choice based on the optical parameters desired for the scanner.

The two reflective elements 201B and 202B are typically disposed in a periscope arrangement; that is, as shown in FIG. 17B, incident radiation impinges on element 201B with an approximate 45 degree angle of incidence and is reflected toward element 202B, where it also impinges with an approximate angle of incidence of 45 degrees. Radiation reflected from element 202B in this exemplary embodiment propagates generally parallel to the incident radiation, that is, towards lens 122.

As reflective element 201B rotates about axis C, the normal to the surface sweeps out a cone in space, where the vertex angle of this cone is twice the angular displacement, cc, between the normal and axis C. As the normal to the surface sweeps out this cone, the angle of incidence of the incident radiation and angle of reflection (and therefore the direction of the reflected radiation) varies in accordance with the laws of basic geometry. Circular arrow 210 notionally depicts the angular sweep of the beam reflected from reflective element 201B.

A similar process occurs at reflective element 202B. Convoluted arrow 212 notionally depicts the complex angular sweep of the beam propagating toward lens 122.

As with the previously described two-dimensional scanner, disposing the two reflective elements in series, coupled with appropriate design and mirror drive commands, permits any scan pattern to be achieved. In this exemplary embodiment of a two-dimensional beam scanner the most natural area scan pattern is a floret scan similar to that illustrated in FIG. 16B, though other scan patterns can also be utilized.

Figure 17C:
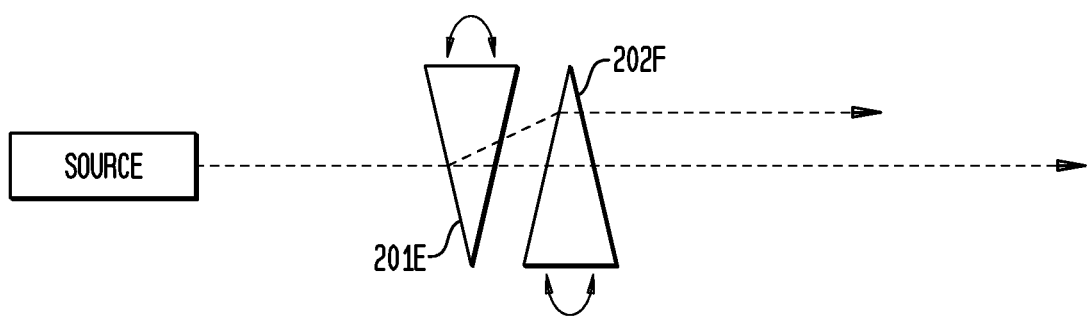

FIG. 17C shows a third exemplary embodiment of scan mechanism 200C, two rotating transmissive, prisms 201C and 202C are used in place of the two reflective elements 201B and 202B, in which embodiment the axes of rotation for the prisms are generally perpendicular to the bisector of prisms' vertex angles. As shown schematically in FIG. 17C, radiation propagates through the prisms and then onto the lens. As illustrated, the radiation propagating through the prisms is deflected laterally in a direction determined by the rotation angles of the prisms. Although each individual prism can only deflect the beam into a direction on the surface of a cone, combining the two prisms in series permits the beam to be deflected anywhere within the volume of a cone. In this exemplary embodiment of a two-dimensional beam scanner the most natural area scan pattern is also a floret scan similar to that illustrated in FIG. 16C, though other scan patterns can also be utilized.

In some embodiments of the invention operating at the wavelengths of interest, refractive prisms can be replaced by their diffractive counterparts, diffraction gratings.

Finally, it will be understood by one of skill in the art that the embodiment of the Binary Fresnel Lens illustrated in FIG. 4 already combines the focusing function of a lens with the deflecting function of a prism (or diffraction grating). Therefore, two-dimensional scan mechanism 200 may comprise one diffraction grating and one BFL, wherein each of these elements is independently rotatable.

In each embodiment of two-dimensional scan mechanism discussed herein, the two scanning elements can be individually equipped with sensing devices (illustrated collectively as item 132 in FIG. 15) used to communicate the instantaneous position of the scanning elements to processor 128.

Figure 15:
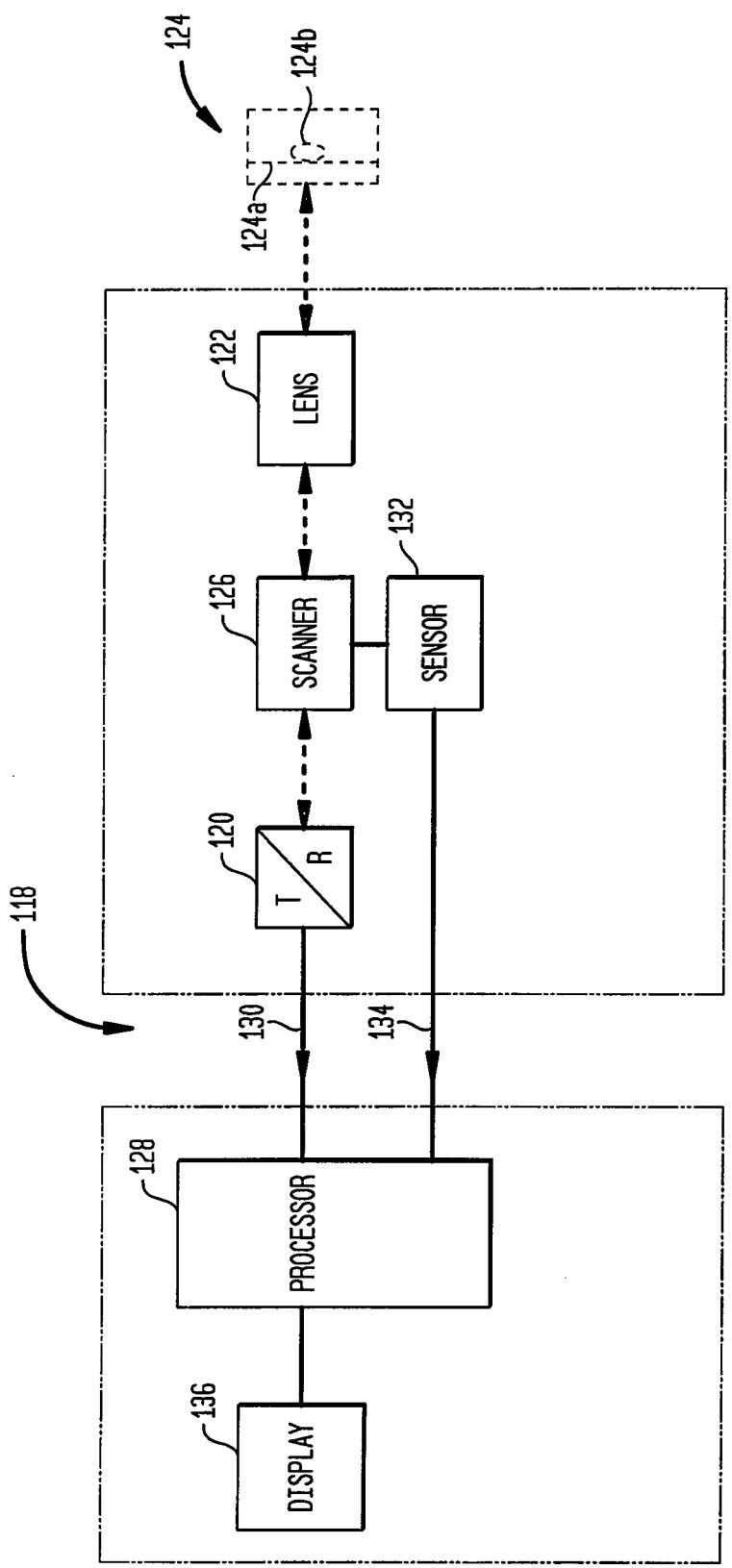
FIG. 15 is a schematic view of an imager according to an embodiment of the invention operating in a snapshot mode, FIG. 16A schematically illustrates a spiral radiation pattern generated by some embodiments of the invention for illuminating an object plane in order to acquire a two-dimensional image thereof, FIG. 16B schematically depicts a floret radiation pattern generated by some embodiments of the invention for illuminating an object plane in order to acquire a two-dimensional image thereof, FIG. 16C schematically depicts a raster radiation pattern generated by some embodiments of the invention for illuminating an object plane in order to acquire a two-dimensional image thereof, FIG. 17A schematically depicts a mechanism for two-dimensional scanning of a radiation beam, which is suitable for use in some embodiments of the invention, FIG. 17B schematically depicts another radiation scan mechanism 200 optically coupled to the source for providing a two-dimensional radiation scan, FIG. 17C schematically depicts another exemplary embodiment of a scan mechanism for generating a two-dimensional radiation scan, which utilizes two rotating transmissive prisms having axes of rotation that are generally perpendicular to the bisector of prisms' vertex angles, FIG. 18 schematically depicts an imager according to another embodiment of the invention capable of generating images of a plurality of axially separated object planes, FIG. 19 schematically illustrates a lens focus-drive mechanism suitable for use in the embodiment of FIG. 18, FIG. 20 schematically depicts an imager according to another embodiment of the invention that utilizes chromatic aberration of a lens for focusing radiation on a plurality of axially separated object planes, FIG. 21 schematically illustrates an imager according to another embodiment of the invention that employs a telecentric arrangement of optical components for acquiring an imager.

With reference to FIG. 15 as well as FIG. 17, one or more objects within the illuminated portion of the object region can reflect (and/or scatter) at least a portion of the incident radiation back towards the lens. For example, by way of illustration, a surface of an object 124b illuminated by the incident radiation can reflect a portion of that radiation back to the lens 122. The lens 122, in turn, directs the back-propagating radiation to the transmit/receive unit 120 for detection. Similar to the previous embodiment, the detector module of the transmit/receive unit generates an electrical signal (typically a time-varying signal) in response to detection of the back-propagating radiation, and communicates this signal to a processor 128, e.g., via a communications channel 130. The magnitude of the generated detection signal at a given time is proportional to the intensity of the reflected radiation detected at that time. The processor also receives information from a radiation scan sensor 132, e.g., via a communications channel 134, regarding the position of the illuminating spot on the object plane as a function of time. For example, the scan sensor can provide the processor with information regarding the instantaneous orientation and rotation rate of each of reflective elements 201 and 202. The processor can convert this information to the position of the illuminating spot on the object plane at any given time. The processor further utilizes this information, e.g., in a manner discussed above, to generate a plurality of image point coordinates, each corresponding to a coordinate in the object plane. The processor further assigns a brightness value to each image point coordinate in proportion to the magnitude of the detected signal associated with an object point corresponding to that image point. In this manner, the processor calculates an image corresponding to the illuminated portion.

Further, the processor generates a plurality of image drive signals for application to a display 136 for displaying the calculated image. In this embodiment, the processor and the display are disposed in separate enclosures with communication channels coupling the processor to the transmit/receive unit as well as the lens position sensor. In other embodiments, the various components of the imager can be housed in a single, preferably handheld, enclosure.

Figure 18:
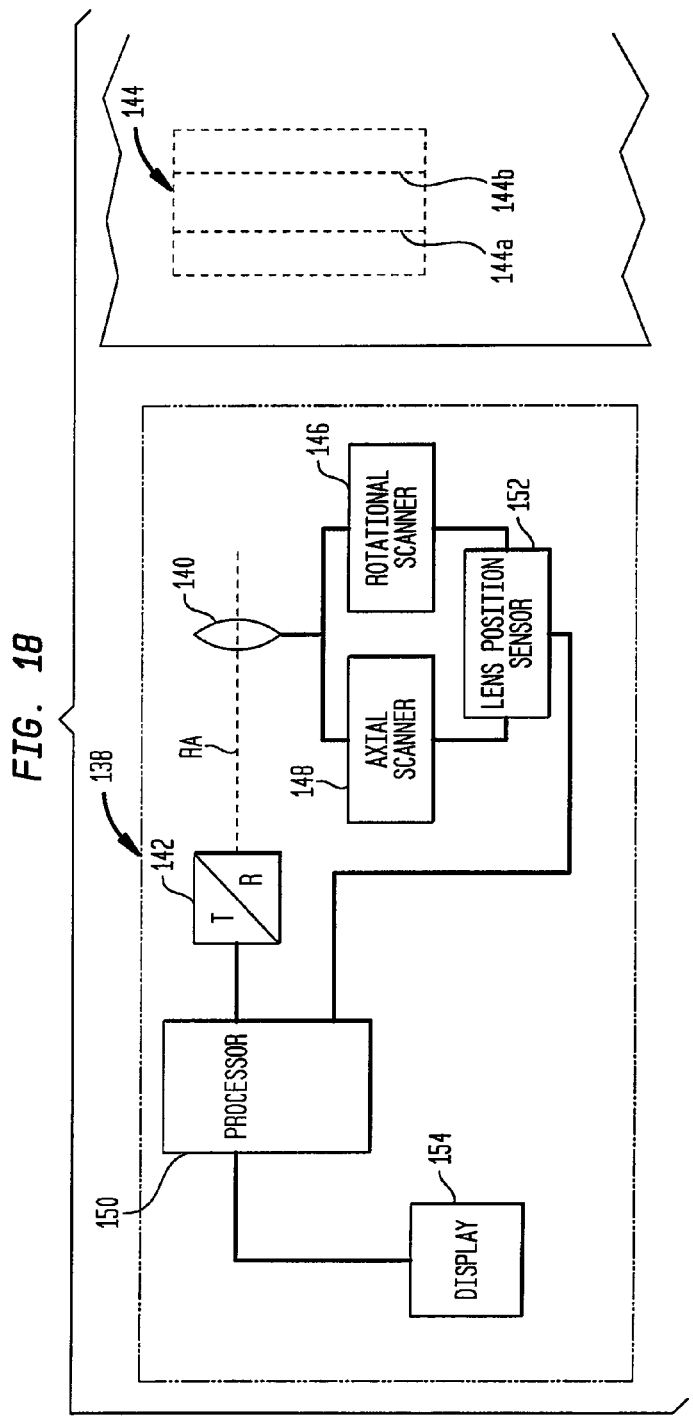
Figure 19:
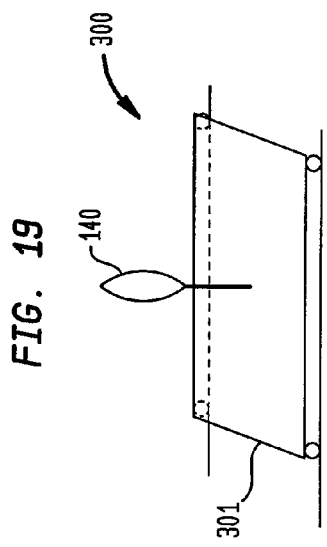

In some embodiments, an imager according to the teachings of invention is capable of acquiring images of a plurality of object planes located at different axial locations (e.g., at difference depths within an obstruction, such as a wall). For example, FIG. 18 schematically depicts an imager 138 according to another embodiment of the invention in which a lens 140 (e.g., a diffractive element whose optical axis is offset relative to its rotation axis) can be axially moved (e.g., along the lens's rotation axis RA) so as to focus radiation generated by a transmit/receive unit 142 at different axial locations within an object region 144. For example, a rotational scan mechanism 146 can rotate the lens, and a focus-drive mechanism 148 can move the lens back-and-forth along its rotational axis so as to focus radiation onto different object planes (e.g., exemplary planes 144a and 144b) within the object region 144. A plurality of focus-drive mechanisms can be employed. By way of example, as shown schematically in FIG. 19, the focus drive mechanism 300 can include a movable stage 301 on which the lens is mounted. In some embodiments, the lens is coupled to a shaft mechanism that rotates and simultaneously axially translates the lens. In such an embodiment, for each axial position of the lens, the rotation of the lens, together with the translation of the imager, can result in scanning the radiation over a path within an object plane. In other embodiments, a zoom lens system can be employed for focusing the radiation on axially separated object planes.

In some embodiments, both transmit/receive unit 142 and lens are axially translated, while preferably maintaining the separation between the transmit/receive unit and the lens, to focus the radiation on planes at different axial locations.

The radiation reflected from each object plane can be detected by the transmit/receive unit, which generates an electrical signal in response to such detection and transmits the signal to a processor 150 for analysis. The imager further includes at least one lens position sensor 152 coupled to the rotational scanner and the focus-drive mechanism for determining the axial position as well as the rotational orientation of the lens (in some embodiments, the functionality of the position sensor 152 can be provided by two separate sensors, one for determining the lens's axial position and the other for determining the lens's rotational orientation). By way of example, the lens position sensor can be implemented as a shaft encoder. The sensor 152 transmits the information regarding the lens's axial position and rotational orientation to the processor 150. The processor employs this information to temporally correlate the detection signal generated by the detector to different object planes, and for each object plane, to a plurality of coordinate positions in that plane. In this manner, the processor can build up a plurality of images, each corresponding to a different depth within the object region. The processor can further generate image drive signals for application to a display 154 for displaying these images, e.g., as a three-dimensional image. In some cases, the processor can cause the display to present selected ones of these images, or present them in a selected sequence, or in any other desired manner.

Although a transmit/unit is employed in the imager 138, in other embodiments, separate source and detector can be employed to generate and detect the radiation, for example, in a manner shown in the above imager 10 (FIG. 1). Further, the imager 118 discussed above, which provides a two-dimensional image of an area of interest while stationary, can be similarly modified to provide a plurality of two-dimensional images at different depths in a region of interest.

In another embodiment, the longitudinal chromatic aberration of the lens can be employed to focus radiation from a source at a plurality of at different depths (e.g., onto a plurality of object planes located at different axial distances from the lens). For example, the frequency of the radiation generated by a source can be varied (tuned) such that the chromatic aberration exhibited by the lens would result in focusing different frequencies at different axial locations from the lens.

Figure 20:
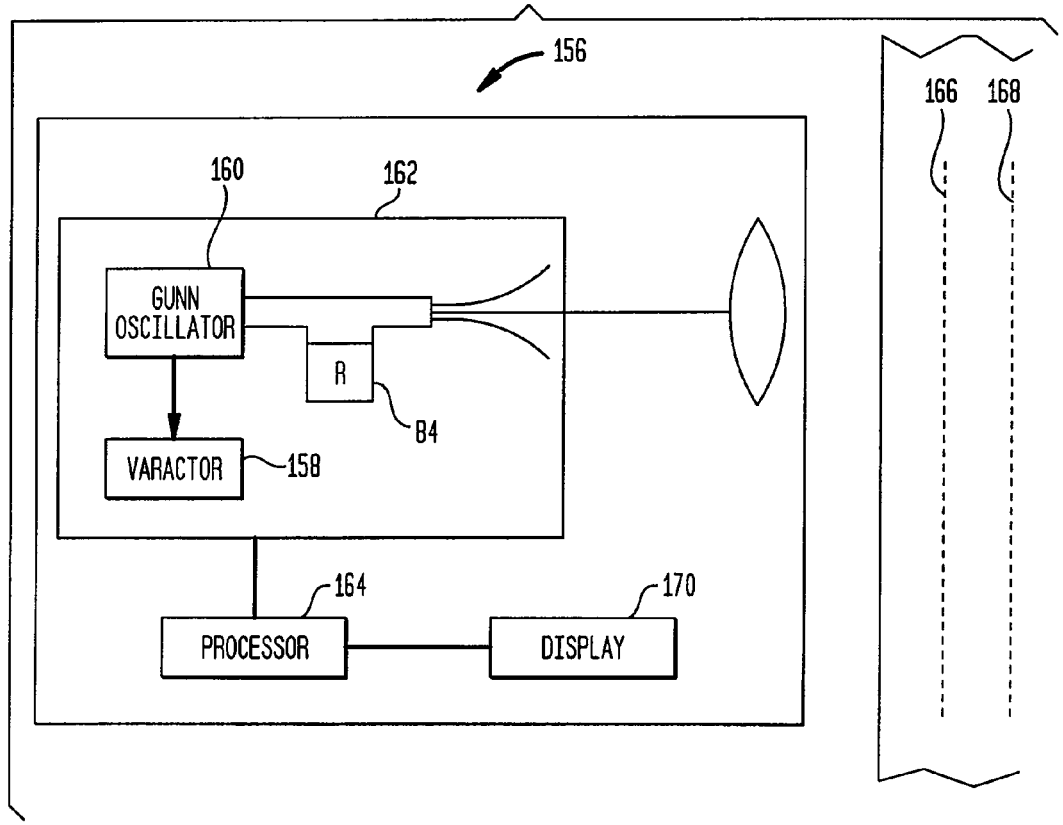

By way of example, FIG. 20 schematically depicts such an embodiment 156 in which a varactor diode 158 is employed to tune the frequency of a radiation source 160 of a Gunnplexer 162. A processor 164 in communication with the Gunnplexer can receive information regarding the frequency of radiation as a function of time. The processor employs this information to temporally correlate detection signals corresponding to the detected back-propagating radiation with different axial locations from the lens. Images of different portions (e.g., different object planes such as exemplary object planes 166 and 168) can then be built up and displayed, e.g., in a manner similar to that discussed above, in a display 170.

Telecentric Embodiments

Figure 21:
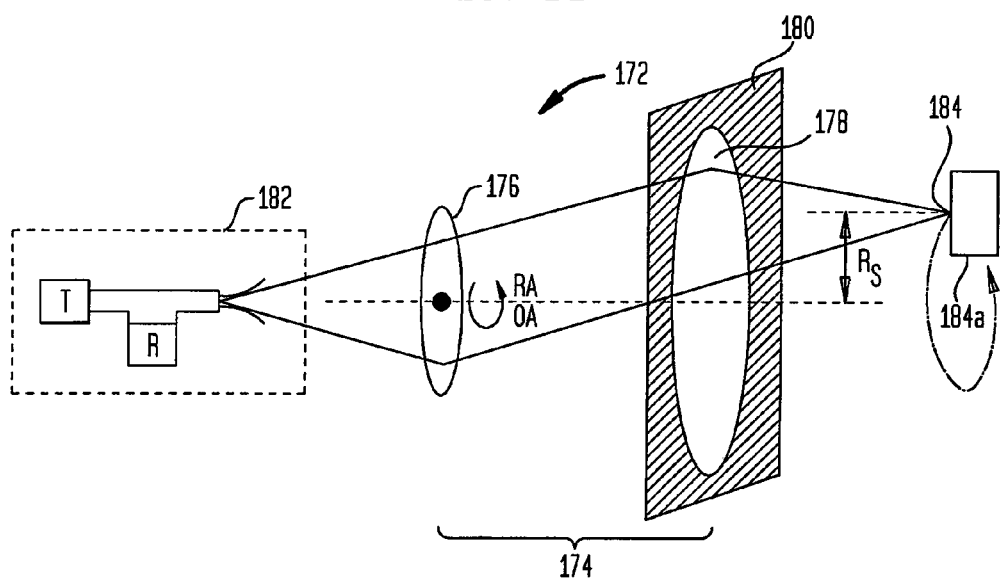
Figure 22A:
FIGS. 22A-22E show test images obtained by utilizing a prototype image constructed in accordance with the teachings of the invention.
Figure 22B:
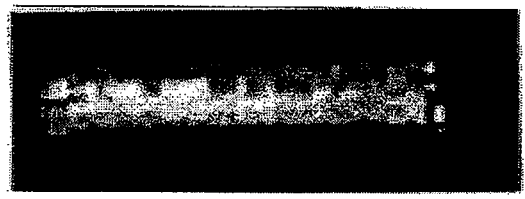
Figure 22C:
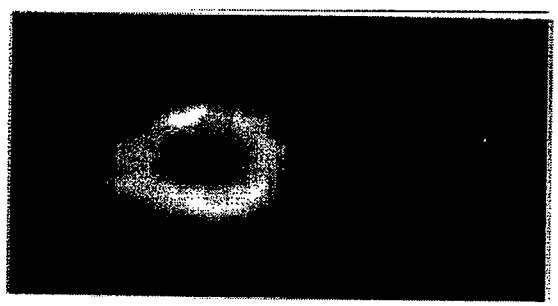
Figure 22D:
Figure 22E:
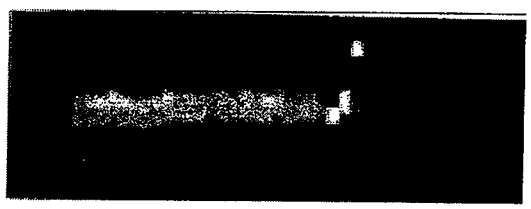

FIG. 21 schematically illustrates an imager (camera) 172 in accordance with another embodiment of the invention that employs a telecentric arrangement of optical elements to acquire an image. The imager comprises a two-element lens system 174 composed of a rotating eccentric pupil lens 176 and a fixed centered lens 178. Fixed lens 178 is illustrated as embedded in a square-shaped surround 180 for clarity only; the surround emphasizes that lens 178 is fixed. The function of the eccentric pupil lens 176 can be understood as being similar to a combination of a collimating lens and a wedge prism. By way of example, a lens portion cut from an edge of a spherical lens or a zone plate lens can be utilized as the lens eccentric lens 176. Other ways of forming the lens 176 are also known to those having ordinary skill in the art.

In the exemplary imager 172, the lens 176 is disposed relative to an emitting aperture of a radiation source 182 at a distance equal to one of its focal lengths. The lens 176 converts an expanding cone of radiation generated by the source into a generally collimated radiation beam, and directs the collimated beam in a predetermined off-axis direction, as shown schematically in FIG. 21. The fixed lens 178 is, in turn, disposed at a selected distance from the lens 176 so as to focus the collimated beam generated by the lens 176 into a point image 184 in a plane at one of its focal lengths in the vicinity of an object region 184$a$. A scan radius $R_s$ (i.e., a radial distance between optical/rotation axis [RA,OA] and the image 184) can be estimated as the product of the angle of propagation of the collimated beam and the focal length of the fixed lens 178. $R_s$ is independent of the distance between the rotating lens 176 and the fixed lens 178. In some embodiments, the fixed lens 178 can be axially moved, e.g., by utilizing mechanisms such as those discussed above in connection with some of the previous embodiments, so as to focus the radiation at different axial locations relative to the imager (e.g., at different depths of a wall or other obstruction). For example, the imager can be held at a generally fixed distance from a planar surface while the lens 178 is axially moved to focus the radiation at different axial distances from that surface.

Preferably, the separation between the lenses 176 and 178 is substantially equal to the focal length of the fixed lens 178. In such a case, the fixed lens 178 forms the image 184 with an imaging cone of radiation whose chief ray is parallel to the optical axis. When the lens 178 is axially moved, the separation between the two lenses can deviate from this preferred value, although in some embodiments, both lenses can be moved so as to provide a depth of scan of the radiation while maintaining the separation between the lenses substantially equal to the preferred value.

EXAMPLE

A prototype imager made based on the above teachings of the invention is discussed in the following example for further illustration of various aspects of the invention. It should, however, be understood that this is intended only for illustrative purposes, and not for indicating optimal performance of imagers according to the teachings of the invention, or to suggest that the specific arrangement of the various optical components and other design parameters utilized in the prototype are in any way meant to limit the scope of the invention.

The prototype imaging system based on the teachings of the invention was fabricated by utilizing a Gunn oscillator operating at a frequency of 24.15 GHz (a wavelength of about 12.4 millimeters) as the emitting source. The Gunn oscillator was coupled to a 10 dB feedhorn, with an exit aperture having dimensions of 15 by 11 mm, so as to output a cone of linearly polarized radiation at a power of 5 mW with an angular spread of +/−57 degrees.

After passage through a 45-degree wire grid polarizer (composed of 30 gauge wires with 0.8 mm center spacing disposed on an Acrylic frame), the radiation from the oscillator was focused to a focal point by an F/0.6 quarter-wave focusing lens, formed of Low Density Polyethylene (LDPE). The lens was configured to image the radiation at a focal spot approximately 100 mm off the lens's optical axis. The distance of the source from the lens (about 125 mm) was substantially equal to that of the image from the lens, thus resulting in a magnification of about 1.

A 32 mm thick birefringent quarter-wave plate, composed of an array of 2.5 mm wide slots cut into a LPDE sheet, was placed between the lens and the focal point. The slots of the quarter-wave plate were oriented at 45 degrees relative to the polarization axis of the incident beam, thus converting the beam's linear polarization to circular polarization. Upon reflection from an object at the focal point and a second passage through the quarter-wave plate, the beam's circular polarization was converted back to linear polarization, albeit with a 90-degree rotation relative to the polarization axis of the incident beam. The back-propagating radiation was then transmitted by the wire grid polarizer to a second Gunn oscillator having an integrated mixer (receiver). The optical system effectively operated in a confocal mode, where the diffracted radiation spot served to illuminate an object and radiation reflected (or scattered) from the object was focused back through a small aperture (the feedhorn entrance) to the mixer detector.

The emitter and receiver Gunn oscillators were tuned to have a frequency mismatch of approximately 2 MHz. This frequency mismatch causes radiation reflected by an object at the focal point and relayed to the receiver to generate a 2 MHz beat frequency signal. The beat frequency was amplified, low-pass filtered (frequency cutoff was about 500 Hz) and rectified. The rectified signal was, in turn, fed to a computer data acquisition system.

By rotating the lens at 300 revolutions-per-minute (rpm), a circularly scanned "probe spot" was generated. A magnet and a Hall effect sensor were utilized to measure the rotational position of the lens. Object imaging was accomplished by moving objects transversely through the scanning focused spot. A sheet of gypsum wallboard having a thickness of about ⅝ inches (15.9 cm) was placed between the lens and the focal plane of the probe spot. Radiation passing through the wallboard interacted with various test objects (e.g., wires, pipes, human skin, etc). A software program was utilized to use the rotational position of the lens so as to determine the Cartesian Coordinates of locations on the focal plane from which the detected reflected radiation originated. This information was utilized, in a manner discussed in detail above, to construct images of objects that were moved transversely through the scanned field.

FIGS. 22A-22E show some illustrative images obtained by the above prototype, illustrating that objects formed from a variety of different materials (e.g., wood, metal, plastic) with features as small as 6 mm can be imaged behind a gypsum wallboard with contrast ratios as high as 10:1.

As noted above, the above prototype was discussed only for illustrative purposes. The particular selections and arrangements of the optical components (e.g., source, lens and receiver) were made only by way of example. Alternative components and arrangements can also be utilized. For example, sources operating at other wavelengths can be employed.

It should be understood that various modifications can be made to the above illustrative embodiments without departing from the scope of the invention. For example, a variety of different lenses can be utilized. The lenses can be fabricated, e.g., as zone plates, parallel metal plates, dielectric materials. Further, the optics can be designed as confocal, near confocal, telecentric, or dark field. The scanning of the radiation can be one or two-dimensional (radial, tangential, raster, or a combination thereof). The camera body location-determining subsystem can be internal or external to the camera body.

Further, the location sensing technology can be mechanical, optical, RF or any suitable mode.

What is claimed is:

1. An imaging system, comprising a housing adapted for positioning on a surface, said housing comprising:
   a source of electromagnetic radiation for generating radiation with one or more frequencies in a range of about 1 GHz to about 2000 GHz,
   an optical system optically coupled to said source so as to focus radiation received therefrom onto an object plane, said optical system directing at least a portion of the focused radiation propagating back from the object plane onto an image plane,
   a scan mechanism coupled to the optical system for receiving radiation therefrom and/or directing radiation thereto, said scan mechanism effecting the scanning of the focused radiation over a two-dimensional portion of the object plane, said housing, optical system, and scan mechanism remaining translationally stationary relative to said surface as said scan mechanism effects the scanning of the radiation,
   a detector optically coupled to said optical system at the image plane to detect at least a portion of the radiation propagating back from a plurality of scanned locations in the object plane, thereby generating a detection signal, and
   a processor in communication with the detector to generate an image of at least a portion of the object plane based on said detection signal,
   wherein said scan mechanism comprises two rotatable refractive elements and said refractive elements comprise a plurality of transmissive prisms, each of said prisms being configured to rotate about a respective rotation axis, and wherein said axes are perpendicular to the bisector of the respective vertex angles of said prisms.

2. The scan mechanism of claim 1, wherein the refractive elements are disposed optically in series.

3. The scan mechanism of claim 1, wherein the refractive elements comprise a two-dimensional raster scanner.

4. The scan mechanism of claim 1, wherein the refractive elements comprise a two-dimensional spiral scanner.

5. The scan mechanism of claim 1, wherein the refractive elements comprise a floret scanner.

6. The imaging system of claim 1, further comprising one or more position sensors coupled to said scan mechanism for determining a two-dimensional position thereof relative to a reference position.

7. The imaging system of claim 1, further comprising a display in communication with said processor for displaying said image.

8. The imaging system of claim 1, wherein said processor maps a variation of said detection signal to said scanned locations so as to generate said image.

9. The imaging system of claim 7, wherein for each image point coordinate corresponding to one of the scanned locations, the display presents a brightness proportional to a strength of the detection signal corresponding to back-propagating radiation from that scanned location.

10. The imaging system of claim 1, wherein said radiation source and said detector are formed as a single transmit/receive module operating in said frequency range of about 1 GHz to about 2000 GHz.

11. The imaging system of claim 1, wherein said housing is a portable housing.

12. The imaging system of claim 11, further comprising an electronic processor and display module (EPDM) that includes said processor.

13. The imaging system of claim 12, wherein said EPDM is integrated within said portable housing.

14. The imaging system of claim 13, further comprising a second housing, separate from the portable housing, for containing said EPDM, said second housing being in data or signal communication with said portable housing.

15. The imaging system of claim 12, wherein said EPDM comprises a display module for displaying said image.

16. The imaging system of claim 1, further comprising a mechanism coupled to the source for modulating frequency of radiation generated by the source.

17. The imaging system of claim 16, wherein said mechanism modulates the radiation frequency at a rate of about 100 kHz.

18. An imaging system, comprising a housing for positioning on a surface, said housing comprising:
   a source of electromagnetic radiation for generating radiation with one or more frequencies in a range of about 1 GHz to about 2000 GHz,
   an optical system optically coupled to said source so as to focus radiation received therefrom onto an object plane, said optical system directing at least a portion of the focused radiation propagating back from the object plane onto an image plane,
   a scan mechanism coupled to the optical system for receiving radiation therefrom and/or directing radiation thereto, said scan mechanism effecting the scanning of the focused radiation over a two-dimensional portion of the object plane, said housing, optical system, and scan mechanism remaining translationally stationary relative to said surface as said scan mechanism effects the scanning of the radiation,
   a detector optically coupled to said optical system at the image plane to detect at least a portion of the radiation propagating back from a plurality of scanned locations in the object plane, thereby generating a detection signal, and
   a processor in communication with the detector to generate an image of at least a portion of the object plane based on said detection signal,
   wherein said scan mechanism comprises a plurality of rotatable diffractive elements and
   wherein said diffractive elements comprise a diffraction grating element and a binary Fresnel lens element, said elements being independently rotatable.

19. The imaging system of claim 18, further comprising one or more position sensors coupled to said scan mechanism for determining a two-dimensional position thereof relative to a reference position.

20. The imaging system of claim 18, further comprising a display in communication with said processor for displaying said image.

21. The imaging system of claim 18, wherein said processor maps a variation of said detection signal to said scanned locations so as to generate said image.

22. The imaging system of claim 21, wherein for each image point coordinate corresponding to one of the scanned locations, the display presents a brightness proportional to a strength of the detection signal corresponding to back-propagating radiation from that scanned location.

23. The imaging system of claim 18, wherein said radiation source and said detector are formed as a single transmit/receive module operating in said frequency range of about 1 GHz to about 2000 GHz.

24. The imaging system of claim 18, wherein said housing is a portable housing.

25. The imaging system of claim 24, further comprising an electronic processor and display module (EPDM) that includes said processor.

26. The imaging system of claim 25, wherein said EPDM is integrated within said portable housing.

27. The imaging system of claim 26, further comprising a second housing, separate from the portable housing, for containing said EPDM, said second housing being in data or signal communication with said portable housing.

28. The imaging system of claim 26, wherein said EPDM comprises a display module for displaying said image.

29. The imaging system of claim 18, further comprising a mechanism coupled to the source for modulating frequency of radiation generated by the source.

30. The imaging system of claim 29, wherein said mechanism modulates the radiation frequency at a rate of about 10 kHz.

\* \* \* \* \*